United States Patent
Murakami et al.

(10) Patent No.: US 7,033,462 B2
(45) Date of Patent: Apr. 25, 2006

(54) VACUUM ARC VAPOR DEPOSITION PROCESS AND APPARATUS

(75) Inventors: Yasuo Murakami, Kyoto (JP); Takashi Mikami, Kyoto (JP); Kiyoshi Ogata, Kyoto (JP); Hiroshi Murakami, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 13 days.

(21) Appl. No.: 10/305,008

(22) Filed: Nov. 27, 2002

(65) Prior Publication Data

US 2003/0104142 A1 Jun. 5, 2003

(30) Foreign Application Priority Data

| | | |
|---|---|---|
| Nov. 30, 2001 | (JP) | P2001-365606 |
| Jun. 4, 2002 | (JP) | P2002-162727 |
| Jun. 4, 2002 | (JP) | P2002-162728 |

(51) Int. Cl.
*C23C 14/34* (2006.01)

(52) U.S. Cl. .............. 204/192.38; 204/298.41

(58) Field of Classification Search .......... 204/192.38, 204/298.41

See application file for complete search history.

(56) References Cited

U.S. PATENT DOCUMENTS

| | | | | |
|---|---|---|---|---|
| 5,433,836 | A | | 7/1995 | Martin et al. .......... 204/298.41 |
| 5,435,900 | A | * | 7/1995 | Gorokhovsky .......... 204/298.41 |
| 5,480,527 | A | * | 1/1996 | Welty .................... 204/192.38 |
| 5,708,274 | A | | 1/1998 | Langner et al. .......... 250/396 L |
| 6,026,763 | A | * | 2/2000 | Kim et al. ............. 118/723 HC |
| 6,361,663 | B1 | | 3/2002 | Berthold et al. ....... 204/192.38 |

FOREIGN PATENT DOCUMENTS

| | | | |
|---|---|---|---|
| JP | 07-316793 | | 12/1995 |
| JP | 10-280135 | | 10/1998 |
| JP | 2001-059165 | * | 3/2001 |
| JP | 2001-214258 | | 8/2001 |
| JP | 2001-230100 | | 8/2001 |
| JP | 2003-166050 | | 6/2003 |
| WO | WO 96/26531 | | 8/1996 |

OTHER PUBLICATIONS

Machine translation of 2001-059165.*
Notice of Reasons for Rejection (Office Action) for Japanese Patent Application No. 2002-162728, mailed Aug. 2, 2005 and English translation thereof.

* cited by examiner

Primary Examiner—Rodney G. McDonald
(74) Attorney, Agent, or Firm—Finnegan, Henderson, Farabow, Garrett & Dunner, L.L.P.

(57) ABSTRACT

To prevent the film forming characteristic deterioration by a magnetic field of a magnetic filter to thereby make vacuum arc vapor deposition uniform, in the invention, plurality of magnets includes a terminal magnet closest to a plasma injection hole located at the other end of duct and specified magnets. The terminal magnet located closest to plasma injection hole may be set to incline to a plasma injection plane of the plasma injection hole. Further, at lease one of specified magnets may be inclined to the plasma injection plane. Further more, at least one of magnetic field generating coils may be formed with a plurality of electromagnetic coils, which are inclined at different angles with respect to a cross section of the duct. One of electromagnetic coils may be selectively energized by current on a basis of setting and controlling of deflection magnetic field generated by the magnetic filter.

35 Claims, 17 Drawing Sheets

ANGLE α CHANGED AT COIL CURRENT 100A

COIL CURRENT CHANGED AT α = 15°

VACUUM ARC VAPOR DEPOSITION PROCESS AND APPARATUS

BACKGROUND OF THE INVENTION

1. Field of the Invention

An invention relates to a vacuum arc vapor deposition method and apparatus for forming a thin film over a surface of a substrate in order to improve a weary resistance property of such a substrata as an automobile part, machine part, machine tool, and metal mold, and more particularly relates to the generation and control of a magnetic field by a magnetic filter.

2. Description of The Related Art

Generally, a vacuum arc deposition is a simple thin film forming process in which arc discharge is caused between a cathode and an anode, and cathode material evaporates to deposit on a substrate to form a thin film thereon. A process is excellent in film production efficiency.

In the vacuum arc deposition process, however, large particles (droplets) of several μm in diameter are emitted from a cathode material (also from the cathode in some discharging conditions). Then, the droplets deposit to the substrate to thereby deteriorate characteristics of forming the film, as known.

To prevent the droplets from deteriorates the characteristics of forming film, some vapor depositing techniques are proposed. A first vapor depositing technique removes the droplets by a magnetic field, which is developed between the cathode and the substrate by use of the magnets, e.g., electromagnetic coils, whereby only a plasma stream is transported along the magnetic field to the substrate. Another technique focuses the plasma to increase a density of the plasma by use of such a magnetic field, and melts the droplets by the high density plasma.

A vacuum arc vapor deposition method and apparatus for removing the droplets and transporting only the plasma stream to the substrate is disclosed by, for example, JP-A-2001-59165 (C23C14/32), Which is filed by the applicant of the present patent application.

The vacuum arc vapor deposition apparatus (arc type ion plating apparatus) as disclosed is constructed as shown in a plan view of FIG. 9.

A metallic vacuum vessel 2, which forms a film forming chamber 1 is evacuated through an exhaust port 3 by a vacuum discharging device (not shown). An inactive gas such as an argon gas or a reaction gas is introduced into the metallic vacuum vessel 2 through a gas introducing port 4 on the left side.

In JP-A-2001-59165, a structure is illustrated in which a plurality of substrates is attached to a cylindrical holder in the film forming chamber 1. In FIG. 9, for simplicity of explanation, one plate-like holder 5 Is placed at a central part in the film forming chamber 1. The holder 5 is rotatably provided while its surface is forwardly directed to a metallic duct 9. A substrate 6 is detachably held on the surface of the holder 5.

The substrate 6 is connected to the cathode of a bias power source 7, through the holder 5, and is DC pulse biased to typically −0.5 kV to 5.0 kV with respect to the vacuum vessel 2.

In FIG. 9, reference numeral 8 designates an insulating member which is provided on a rear surface of the vacuum vessel 2 and for insulating the cathode of a bias power source 7.

The metallic duct 9, rectangular in cross section, is extended forward from the metallic vacuum vessel 2, while being curved to the left (in the FIG. 9). An evaporating source 11 is provided at the central part of an end plate 9'. One end of the end plate 9' is earthed. The evaporating source 11 is located at the front end of the duct 9 in a state that an insulating member 10 is interposed between them. A cathode of an arc power source 12 of about several tens V is connected to the evaporating source 11. An anode of the arc power source 12 is earthed. Therefore, the duct 9 works as an anode and the evaporating source 11 works as a cathode.

An anode electrode is severally provided instead of the duct 9.

The evaporating source 11 includes a water-cooling mechanism, vacuum sealing mechanism, trigger mechanism and the like.

Magnetic field generating coils 14a to 14d, while surrounding the duct 9, are provided at a plurality of positions between both ends of the duct 9.

The magnetic field generating coils 14a to 14d, numbered #1 to #4 from on a end of the duct 9, are disposed parallel to the cross section of the duct 9.

The electromagnetic coil 14d of the terminal magnet is disposed parallel to the cross section of the duct 9 and the plasma injection plane of a plasma injection hole 13 and the substrate.

The magnetic field generating coils 14a to 14d are connected in series between the output terminals of a coil power source 15 as a current source. Coil current or the magnetic field generating coils 14a to 14d is controlled under coil current control of the control unit 16. When the controlled current is fed to the magnetic field generating coils 14a to 14d, a deflection magnetic field 17a is generated which is curved along the duct 9 as indicated by a solid line loop. The deflection magnetic field 17a forms a magnetic filter 18a.

Magnetic field generating coils 14a to 14d are provided at a plurality of positions between both ends of the duct 9, while surrounding the duct 9. Those magnetic field generating coils 14a to 14d are numbered #1 to #4 from one end of the duct 9.

The #4 electromagnetic coil 14d as the terminal magnet closest to the plasma injection hole 13, and the remaining #1 to #3 electromagnetic coils 14a to 14c are equal in the number of turns and in size.

The electromagnetic coil 14d is substantially parallel to the cross sectional plane of the duct 9, which is perpendicular to the extending direction of the duct 9 as indicated by a two-dot chain line, and parallel to the plasma injection surface of the plasma injection hole 13. The remaining electromagnetic coils 14 are also substantially parallel to the cross sectional plane of the duct 9.

The other end of the duct 9 is mounted oh the central part of the front plate 2" of the vacuum vessel 2. The plasma injection hole 13 of the other end of the duct 9 communicates with the film forming chamber 1. The center of the plasma injection plane of the plasma injection hole 13, which extends horizontally (to the horizontal directions), is aligned with the center of the combination of the holder 5 and substrate 6.

In the vacuum arc vapor deposition apparatus, vacuum arc discharge occurs between the duct 9 as the anode and the evaporating source 11 as the cathode. At this time, conductive, cathode materials 19, such simple metals of the evaporating source 11 as Ti, Cr, Mo, Ta, W, Al and Cu, and alloys, e.g., TiAl, are evaporated from the evaporating source.

Plasma streams 20a, indicated by broken lines with arrows, containing electrons generated by the arc discharge and ions of the cathode material 19 are transported from one end of the duct 9 to the plasma injection hole 13 located at the other end thereof, along the deflection magnetic field 17a.

Each droplet emitted from the evaporating source 11 is electrically neutral or negatively charged in the plasma. In any case, the mass of the droplet is considerably large. Accordingly, it moves straight forward independently of the deflection magnetic field 17a to impinge on the inner wall of the duct 9, so that the droplet is removed from the plasma stream 20a. Therefore, the droplet rails to reach the surfaces of the substrate 6 and the holder 5.

Ions of the cathode material 19 having arrived at the plasma injection hole 13 are led into the film forming chamber 1 under a negative bias potential of the substrate 6 caused by the bias power source 7. The ions are sputtered onto the surface of the substrate 6 to thereby form a vapor deposited film made of the cathode material 19 on the surface of the substrate 6.

A reaction gas is introduced into the film-forming chamber 1 through the gas introducing port 4. Then, the gas reacts with ions of the cathode electrode material 19 to vapor deposit on the surface of the substrate 6 a thin film of metal compound, such as titanium carbide, titanium nitride, alumina and titanium dioxide.

When the reaction gas is not introduced, a carbon film or the like is formed by vapor deposition an the surface of the substrate.

In the vacuum arc vapor-deposition by the conventional apparatus of FIG. 9, the electromagnetic coil 14d of the terminal magnet is disposed parallel to the plasma injection plane of the plasma injection hole 13 and the substrate 6.

In the vacuum arc deposition of the conventional vacuum arc vapor deposition apparatus of FIG. 9, the magnetic field generating coils 14a to 14d are disposed parallel to the cross section of the duct 9, and the generated magnetic field characteristics of the magnetic filter 18a are fixed to various characteristics as defined by their installing conditions.

In the vacuum arc vapor-deposition by the conventional apparatus of FIG. 9, the electromagnetic coil 14d of the terminal magnet is disposed parallel to the cross sectional plane of the duct 9, and the plasma injection surface of the plasma injection hole 13 and the substrate 6. The remaining electromagnetic coils 14a to 14c are also substantially parallel to the cross sectional plane or the duct 9 at their positions.

When an electron is transported in a uniform magnet field, as well known, the electron receives Lorentz forces F given the following formula 1.

$$F = q \cdot (v \times B) \quad \text{[Formula 1]}$$

where v=electron (outer) velocity in a direction perpendicular to the magnetic field
B=magnetic field
x=operator of the vector product
·=operator of the inner vector Under the Lorentz forces F, the electron travels along the magnetic field lines of a deflection magnetic field 17a, while spirally rotating.

Ions of the cathode material 19 travel within and along the duct 9 while being pulled by the electrons, and are transported to the plasma injection hole 13.

At this time, in the vicinity of the electromagnetic coil 14d as the terminal magnet, as indicated by magnetic field lines of solid lines in FIGS. 10A and 10B a diverging magnetic field is present. Electrons and ions having reached the plasma injection hole 13 travel along the diverging magnetic field.

FIGS. 10A and 10B are a plan view and a right side view showing a distribution of magnetic field lines developed respectively when current is fed to only the two magnetic field generating coils 14b and 14d of those magnetic field generating coils 14a to 14d, viz.

The traveling paths of electrons along the magnetic field lines correspond to the traveling paths of ions of the cathode electrode material 19, which travel while being attracted by electrons. Therefore, one can grasp the paths of ions of the cathode electrode material 19 from the electron traveling paths.

The traveling paths of electrons by the magnetic field lines of FIGS. 10A and 10B are as illustrated in a plan view and a right side view of FIGS. 11A and 11B.

Under the diverging magnetic field, a position on the substrate at which the electron arrives is horizontally deflected from the center of the substrate 6 and diverged in up and down directions (vertical directions) in accordance with its curving direction.

As shown in a plan view of FIG. 19, a centrifugal force Fcf of an outward direction, a magnetic field inclination (gradient) ∇B of an inward direction act on electrons and ions in a vacuum curved magnetic field, such as the deflection magnetic field 17a, and drifts occur as given by the following formula 2.

$$v(R) + v(\nabla B) = (m/q) \cdot (Rc \times B) \cdot (v(\|) + v(\perp)^2/2) \quad \text{[Formula 2]}$$

where
v(R=velocity drift of Fcf
v(∇B)=velocity drift of v(∇B)
m=mass
(v(∥)=velocity in the B direction (extending direction) of the duct 9
V(⊥)=velocity of the vertical line
Rc=radius of curvature at a position x in FIG. 19
q=electric charge In the above equation, "Rc×B" indicates a vector having a direction in which a right-handed screw advances when the radius or curvature Rc is rotated while being placed on the magnetic field B.

Ions in the plasma 20a show a tendency that the ions travel while being drawn by electrons. By the drift effect, the ion depositing position is further deviated from a target position.

The cross section of the duct 9 and the magnetic field generating coils 14a to 14d are each rectangular in cross section. Because of the magnetic field characteristics of the magnetic field generating coils 14a to 14d, the inclination ∇B of the magnetic field increases toward the outer side of the cross section. Accordingly, the drift velocity having an obliquely downward direction increases, and hence, the divergence to a downward direction increases.

In the vacuum arc vapor deposition apparatus of this type which removes droplets by use of the magnetic filter 18a, it is difficult vapor deposit a thin film of the cathode electrode material 19 at a target position on the substrate 6 so as to have a thin film of an intended thickness. In this respect, the conventional vacuum arc vapor deposition apparatus described above is not satisfactory in obtaining a uniform film forming characteristic.

Similar problems arise independently of the number of evaporating sources 11.

A possible approach for ameliorating the film forming characteristics is present in which by adjusting installing angles (inclinations) of the magnetic field generating coils 14a to 14d, a magnetic field generated by the magnetic filter 18a is set and controlled to correct the traveling paths (plasma path) of ions and electrons. To adjust installing angles (inclinations) of the magnetic field generating coils 14a to 14d by actually moving the magnetic field generating coils 14a to 14d, a complicated and expensive 3-dimensional rotary mechanism for moving the magnetic field generating coils 14a to 14d must be used. Therefore, it is impossible to set and control the magnetic field characteristics generated by the magnetic filter 18a through an easy and inexpensive adjustment.

Let us consider a case where three evaporating sources 11 are vertically disposed and of those evaporating sources, the top evaporating source 11 named as an upper cathode, the middle one, as a middle cathode, and the bottom one, as a lower cathode. The electrons emitted mainly from the upper cathode are affected by the upward curve of the magnetic field B, and the electrons emitted from the lower cathode are affected mainly by the downward curve of the magnetic field B. The electrons from the upper and lower cathodes drift in the following directions in accordance with the forward and reverse directions (clockwise and counterclockwise) of the coil current when one sees from the cathodes to the substrate 6, as shown in Table 1. The electron drift direction is symmetrical with respect to the upper and lower cathodes and the forward and reverse directions of the coil current.

TABLE 1

| | Drift direction | |
|---|---|---|
| Current directions Cathode | Clockwise | Counterclockwise |
| Upper | Lower left | Upper right |
| Lower | Lower right | Upper left |

Ions in the plasma 20a show a tendency that the ions travel while being drawing by electrons.

By the drift effect, an ion depositing position is further deviated from a target position.

In the vacuum arc vapor deposition apparatus of this type which removes droplets by use of the magnetic filter 18a, it is difficult vapor deposit a thin film of the negative electrode material 19 at a target position on the substrate 6 so as to have a thin film of an intended thickness. In this respect, the conventional vacuum arc vapor deposition apparatus described above is not satisfactory in obtaining a uniform film forming characteristic.

Similar problems arise independently of the number of evaporating sources 11 in the vacuum arc deposition of this type which removes the droplets by the utilization of the function of the magnetic filter.

in other case, a diverging magnetic field B has a gradient $\nabla B$. Charged particles, e.g., electrons, drift in a direction in which a right-handed screw advances when the gradient $\nabla B$ rotates at a velocity B given by the following formula 102, while being placed on the diverging magnetic field B. The $\nabla B$ drift further deviates the electron path.

$$VB = -\mu \cdot (\nabla B \times B)/(q \cdot B2) \quad \text{[Formula 102]}$$

where $\mu$=magnetic permeability
q=electric charge
B=magnetic field vector,
$\nabla B$=gradient vector of the magnetic field B,
x=operator of the vector product
·=operator of the inner vector In this situation, it is impossible to land ions of the cathode material 19 at desired positions, e.g., the central part on the surface of the substrate 6, and therearound.

The cross section of the duct 9 and the magnetic field generating coils 14a to 14d are each rectangular in cross section. Because of the magnetic field characteristics of the magnetic field generating coils 14a to 14d, the inclination $\nabla B$ of the magnetic field increases toward the outer side of the cross section. Accordingly, the drift velocity having an obliquely downward direction increases, and hence, the divergence to a downward direction increases.

It is impossible to set the landing center of the ions of the cathode material 19 at the center of the surface of the substrate 6, for example. Even if the landing positions of the ions of the cathode material 19 are periodically shifted by periodically reversing the direction of the current flowing through each of the electromagnetic coils 14a and 14d, it is impossible to form a film on the substrate 6 by vapor depositing the cathode material 19 at a desired position on the substrate 6. In this respect, the vacuum arc vapor deposition apparatus is not satisfactory in obtaining a uniform film formation.

SUMMARY OF THE INVENTION

It is an object of the present invention to prevent a horizontal offset of a landing position of a cathode material and a vertical diversion of the cathode material, which is due to a diverging magnetic field in a vicinity of a terminal magnet (electromagnetic coil), and hence, to vapor deposit a uniform thin film on a substrate, and to control, as desired, positions on the substrate at which ions of the cathode material land to thereby secure a further enhancement of the film forming characteristics.

It is a further object of the present invention to adjust, set and control, in simple and inexpensive manner, a magnetic field characteristic of a magnetic filter in this type of vacuum arc vapor deposition apparatus without actually moving a magnetic-field generating coil, and hence to improve the film forming characteristic It is another object of the present invention is to improve the film forming characteristic for the substrate by focusing our attention to the electron drift caused by the magnetic field generated by the magnet located closer to one end (evaporating source) of the duct of the magnetic filter rather than by the terminal magnet (electromagnetic coil). Another object of the invention is to further enhance the film forming characteristic by controlling, as desired, a position on the substrate at which the ion of the negative electrode material reaches.

To achieve the invention, a vacuum arc vapor deposition process or the invention is characteristically featured in that the terminal magnet located closest to the plasma injection hole is disposed inclined to a plasma injection plane of the plasma injection hole, and traveling directions of the ions are controlled by a magnetic field generated by the terminal magnet.

The terminal magnet is mounted inclined at an appropriate angle to the plasma injection plane of the plasma injection hole, while it is parallel to the plasma injection plane in the conventional art. With this feature, under a magnetic field developed by the terminal magnet, ions of cathode material travel and land at the central part on the surface of the substrate.

By setting the mounting angle of the terminal magnet at appropriate values, ions of the cathode material land at a target position on the surface of the substrate. As a result, a vapor deposited thin film can be formed at desired film forming characteristics.

In a preferred embodiment of the invention, the mounting angle of the terminal magnet is variable.

The mounting angle of the terminal magnet may be varied before and during the film forming process. Accordingly, vapor deposited thin films of various film forming characteristics can be formed as desired.

In another predetermined embodiment, the terminal magnet is different in size from the remaining magnets.

The diverging magnetic field of the terminal magnet, in particular its vertical diversion can variously be controlled by varying the size of the terminal magnet. For example, if the terminal magnet is larger than each of the remaining magnets, the vertical diversion of the magnetic field is suppressed in high level at a position closer to the substrate than the plasma injection plane, and the particles of the cathode material to be deposited are prevented from vertically expanding. As a result, the film is more uniformly formed with more excellent film forming characteristics.

It is practical and preferable that each of the magnets preferably consists of an electromagnetic coil.

Further, it is preferable that the mounting angle of the terminal magnet is automatically controlled.

To secure satisfactory film forming characteristics, it is preferable that each magnet consists of an electromagnetic coil, and coil current fed to each electromagnetic coil of the magnet is controlled in connection with the control of the mounting angle of the terminal magnet.

If a plurality of evaporating sources is used, the film forming ability is improved, and plural kinds of cathode materials may be used for film formation.

The direction of the coil current fed to each electromagnetic coil forming each magnet may be reversed at fixed time interval. If so done, the electron drift direction is reversed, and the landing positions of the ions of the cathode material are periodically shifted, and consequently, a film is formed uniformly over a substrate of a large area.

According to another aspect of the invention, there is provided a vacuum arc vapor deposition apparatus being characteristically featured in that the terminal magnet located closest to the plasma injection hole is disposed inclined to a plasma injection plane of the plasma injection hole.

The vacuum arc vapor deposition apparatus may include means for varying the mounting angle of the terminal magnet.

Accordingly, the vacuum arc vapor deposition apparatus thus constructed may be used for executing the first and second vacuum arc vapor deposition processes.

The terminal magnet may be different in size from the remaining magnets.

By so constructing, a function to suppressing a vertical diversion of the magnetic field is given to the first and second vacuum arc vapor deposition apparatus.

It is practical that each of the magnets preferably consists of an electromagnetic coil.

Further, it is preferable to use an automatic control means for automatically controlling the mounting angle of the terminal magnet.

To secure satisfactory film forming characteristics, it is preferable that each magnet consists of an electromagnetic coil, and to use means for controlling coil current fed to each electromagnetic coil of the magnet in connection with the control of the mounting angle of the terminal magnet.

A plurality of evaporating sources may be used, and the direction of the coil current fed to each electromagnetic coil forming each magnet may be reversed at fixed time intervals.

To achieve the second aspect of the invention, a vacuum arc vapor deposition apparatus of the invention is characteristically featured in that at least one of the magnetic-field generating coils is formed with a plurality of electromagnetic coils, which are inclined at different angles with respect to the cross section of the duct, while surrounding the duct, and the electromagnetic coils are selectively energized by current as fed, depending on the setting and controlling of the magnetic field of the magnetic filter.

At least one of magnetic-field generating coils, which form a magnetic filter, is formed with a plurality of electromagnetic-coils, which are inclined at different angles with respect to the cross section of a duct, while surrounding the duct. One of the electromagnetic coils is selected and fed with current. A magnetic field characteristic of each magnetic-field generating coil is a magnetic field characteristic of the electromagnetic coil as fed with current. The characteristic of the magnetic filter may be adjusted, set and controlled without actually inclining the magnetic-field generating coil.

Therefore, there is no need of using a complicated, expensive rotary mechanism for circularly moving the magnetic-field generating coil. Accordingly, the magnetic field characteristic of the magnetic filter is set and controlled easily and with simple and inexpensive construction to thereby form a uniform thin film on the substrate, and hence, the film forming characteristic and the like is improved.

It is practical that the plurality of electromagnetic coils surrounding the duct are provided while being inclined at different angles in one of two planes perpendicular to the cross section of the duct.

The plurality of electromagnetic coils surrounding the duct are different in coil size, or are equal or substantially equal in coil size.

To achieve the third aspect of the invention, in a first vacuum arc vapor deposition process, of the magnets forming the magnetic filter, at least one specified magnet closer to the evaporating source than the terminal magnet closes to the plasma injection hole is inclined to the cross sectional plane of the duct, and the ion traveling directions are controlled by a magnetic field generated by the specified magnet.

Of the magnets forming the magnetic filter, one or more magnets except the terminal magnet is actively inclined to the cross section plane of the duet, while being disposed around the duct. The deflection or a deflection magnetic field generated by those magnets is different from that of a magnetic field generated by the conventional method, which is substantially parallel to the cross sectional plane of the duct. If the inclination angle of the magnet is appropriately selected, traveling directions of the electrons and ions extracted from the plasma stream are corrected, the above-mentioned drift is suppressed, and the landing position of the cathode material is little affected by the drift. Consequently, the film forming characteristic is improved.

In a second vacuum arc vapor deposition process, as in the first vacuum arc vapor deposition process, the specified magnet is inclined to the cross sectional plane of the duct, and the terminal magnet is inclined to the plasma injection plane of the plasma injection hole, and the traveling directions of ions of the cathode material are controlled by magnetic fields generated by the specified magnet and the terminal magnet.

In this case, a magnetic field generated by the terminal magnet is different from that in the conventional case where the terminal magnet is disposed in parallel with the plasma injection plane of the plasma injection hole.

By appropriately setting the mounting angles of the specified magnet and the terminal magnet, the traveling directions of electrons and ions are corrected by the magnetic fields by the specified magnet and the terminal magnet. The above-mentioned drift is suppressed, and the film forming characteristic is further improved.

In a vacuum arc vapor deposition process of the invention, the mounting angle of the specified magnet and/or the terminal magnet is variable.

The mounting angle of the specified magnet and/or the terminal magnet may be varied before and during the film forming process. Vapor deposited films of various film forming characteristics may be formed having intended characteristics.

In the second or third vacuum arc vapor deposition process the magnets are preferably electromagnetic coils.

The mounting angle of the specified magnet and/or the terminal magnet is automatically controlled.

Each magnet consists of an electromagnetic coil, and coil current fed to each electromagnetic coil of the magnet is controlled in connection with the control of the mounting angle of the specified magnet and/or the terminal magnet. This technical feature is preferable in the light of film forming characteristic.

If a plurality of evaporating sources is used, the film forming ability is improved, and plural kinds of cathode materials may be used for film formation.

The direction of the coil current fed to each electromagnetic coil forming each magnet may be reversed at fixed time intervals. If so done, the electron drift direction is reversed, and the landing positions of the ions of the cathode material are periodically shifted, and consequently, a film is formed uniformly over a substrate of a large area.

According to another aspect of the invention, there is provided a vacuum arc vapor deposition apparatus which is characteristically featured in that at least one specified magnet closer to the evaporating source than the terminal magnet closes to the plasma injection hole is inclined to the cross sectional plane of the duct, and the ion traveling directions are controlled by a magnetic field generated by the specified magnet.

In a vacuum arc vapor deposition apparatus of the invention, the specified magnet is inclined to the cross sectional plane of the duct, and the terminal magnet is inclined to the plasma injection plane of the plasma injection hole.

The present invention provides a vacuum arc vapor deposition apparatus adaptable for the first and second vacuum arc vapor deposition processes.

A vacuum arc vapor deposition apparatus of the invention includes means for varying the mounting angle of the specified magnet and/or the terminal magnet, and executes the third vacuum arc vapor deposition process.

In vacuum arc vapor deposition apparatus of the invention, it is practical that the magnets are electromagnetic coils, and it is preferable to include means for automatically controlling the mounting angle of the specified magnet and/or the terminal magnet.

Each magnet consists of an electromagnetic coil, and means for controlling coil current fed to each electromagnetic coil of the magnet in connection with the control of the mounting angle of the specified magnet and/or the terminal magnet is additionally included. This technical feature is preferable in the light of film forming characteristic.

A plurality of the evaporating sources may be provided, and current control means for reversing the direction or the coil current fed to each electromagnetic coil forming each magnet at fixed time intervals, is further included.

A BRIEF DESCRIPTION OF THE DRAWINGS

Figure 9:
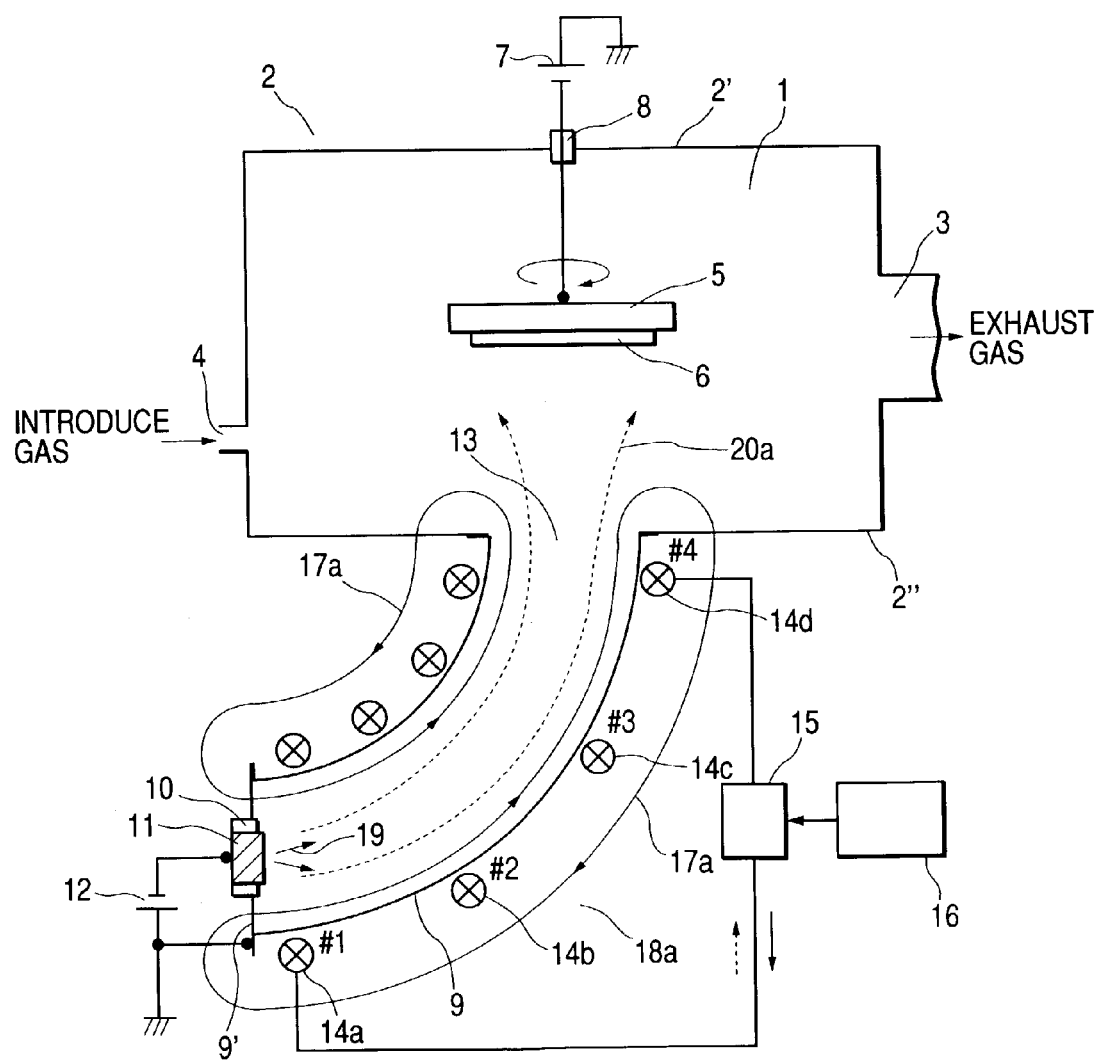
FIG. 9 is a plan view showing a conventional vacuum arc vapor deposition device.
Figure 10A:
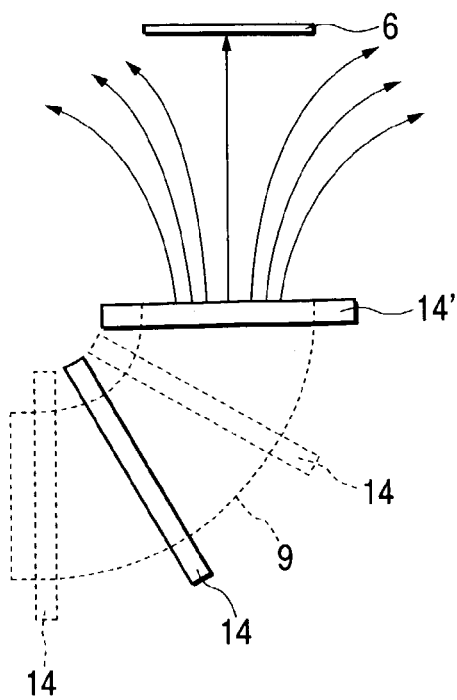
Figure 10B:
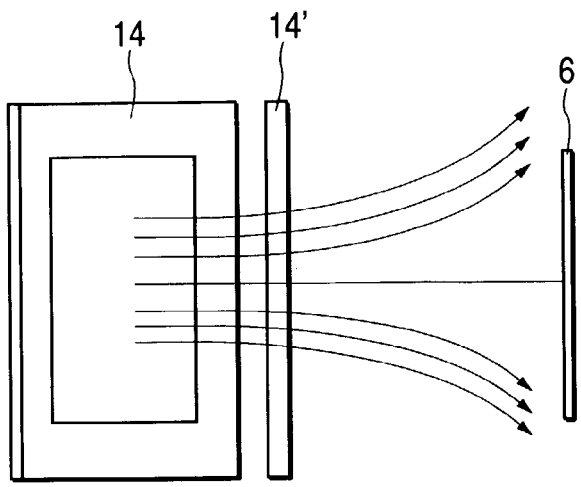
Figure 11A:
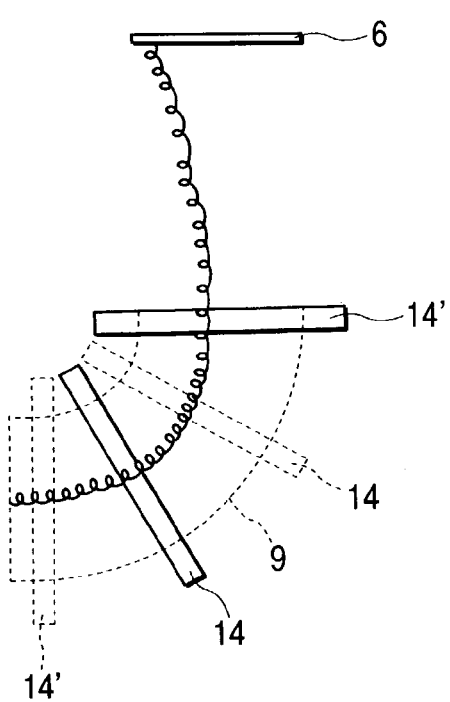
Figure 11B:
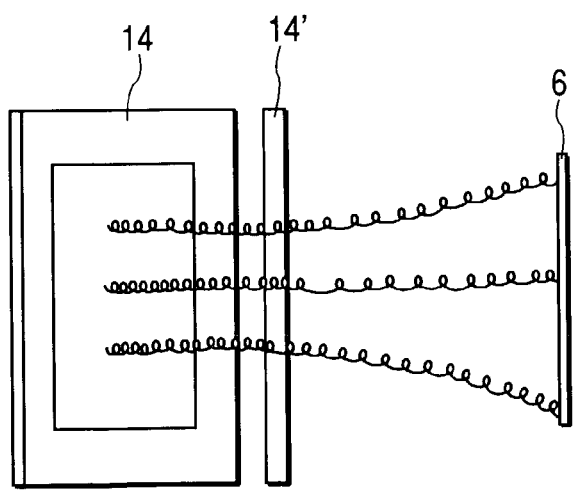
Figure 12:
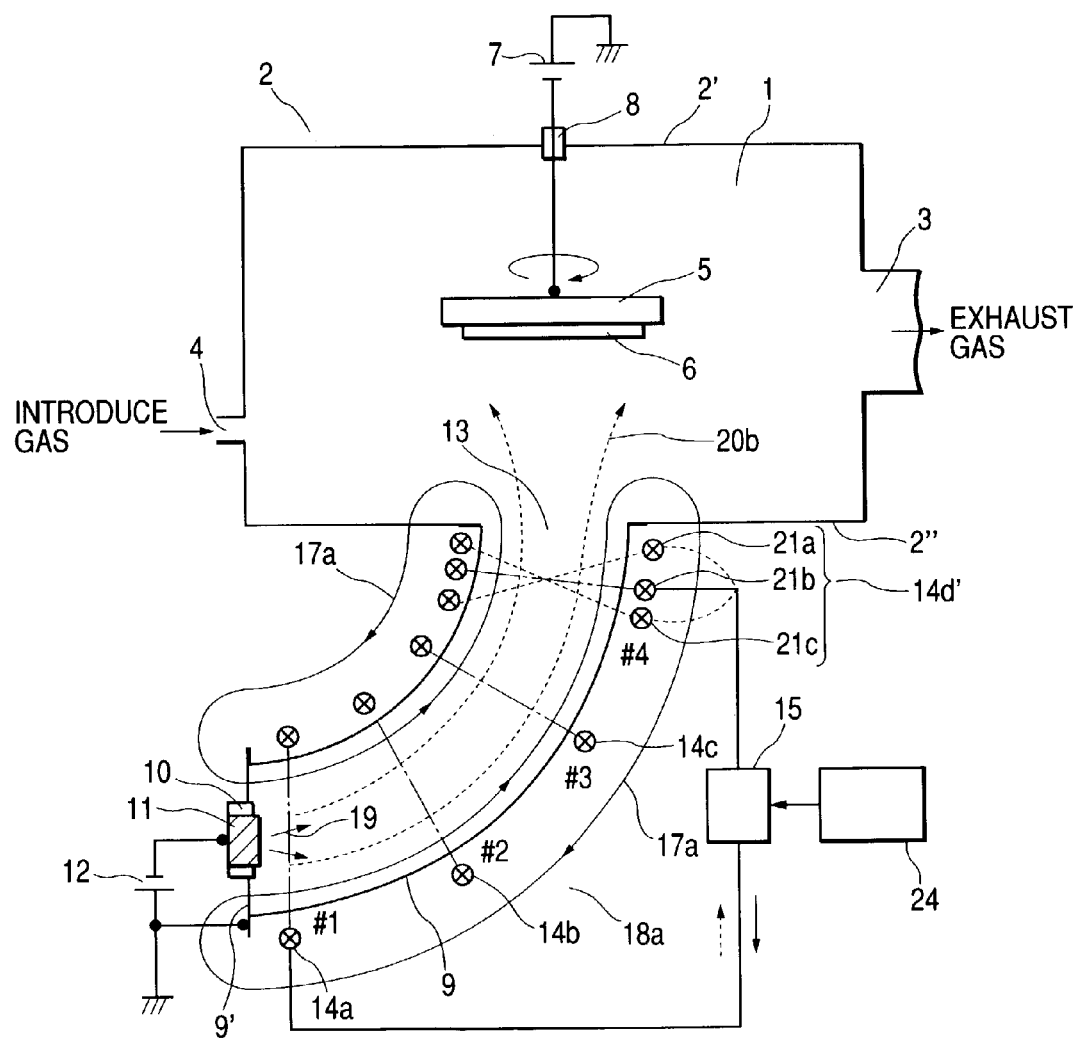
Figure 13:
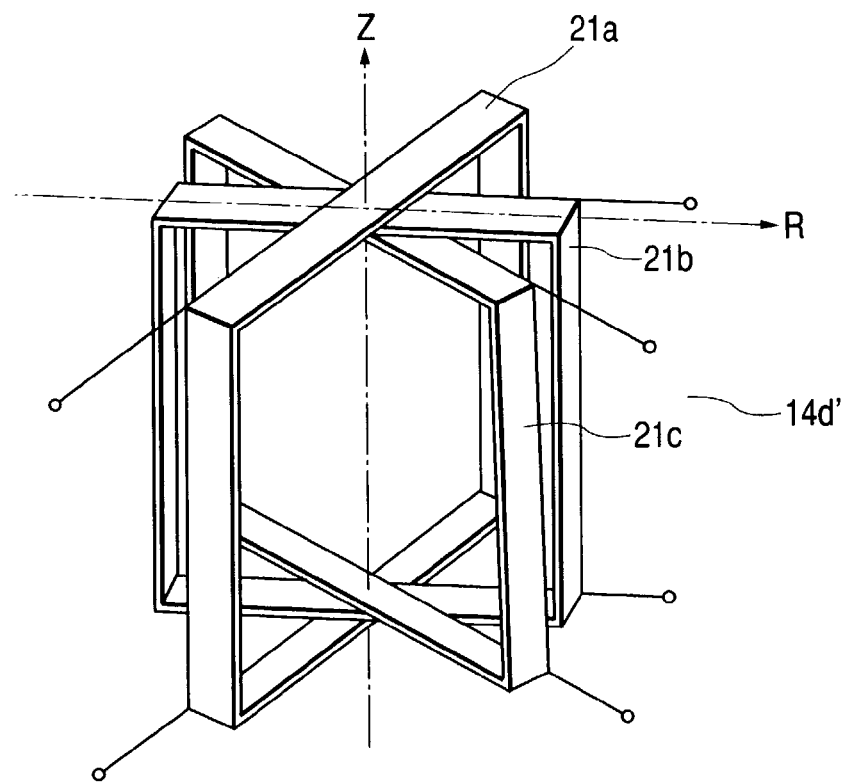
Figure 14A:
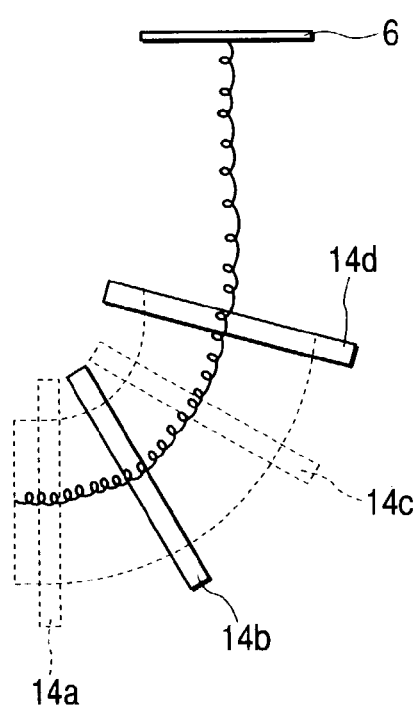
Figure 14B:
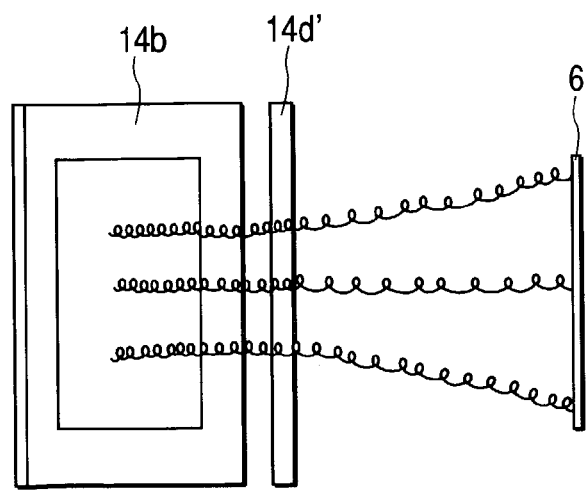
Figure 15:
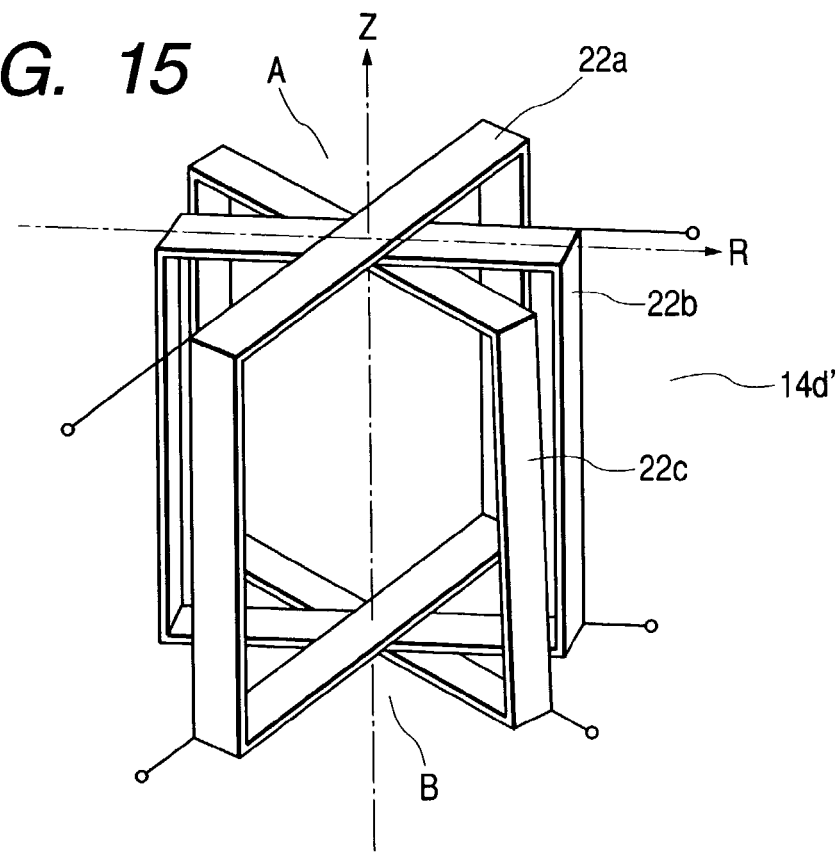
Figure 16:
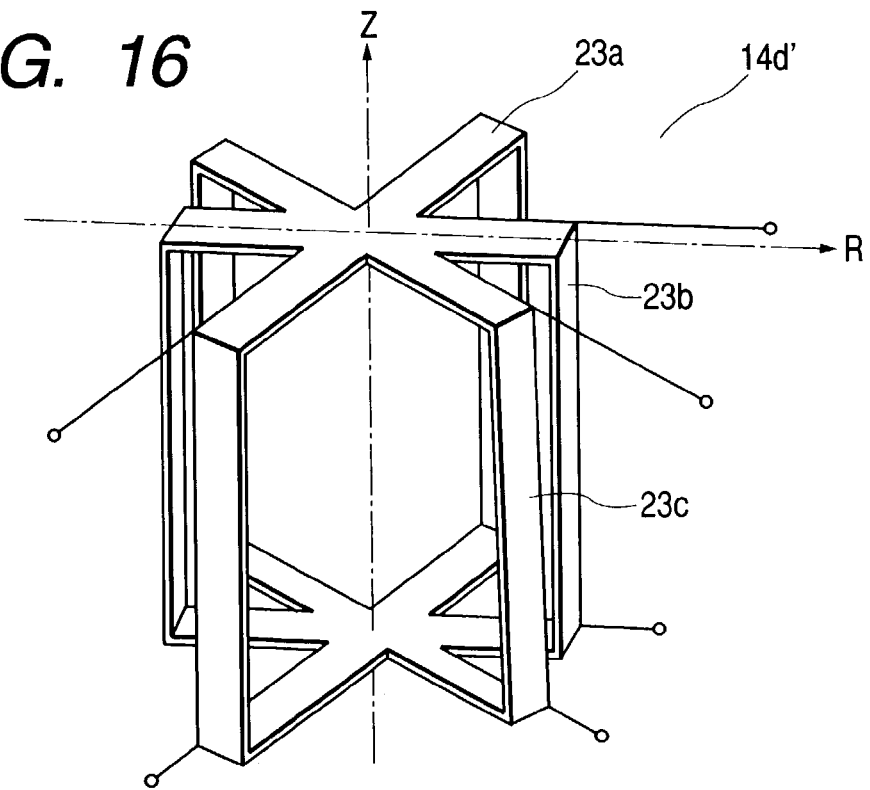
Figure 17:
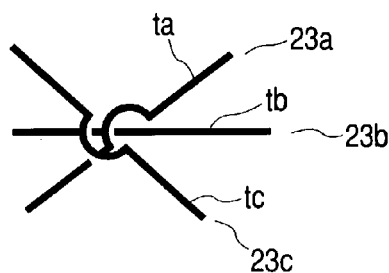
Figure 18:
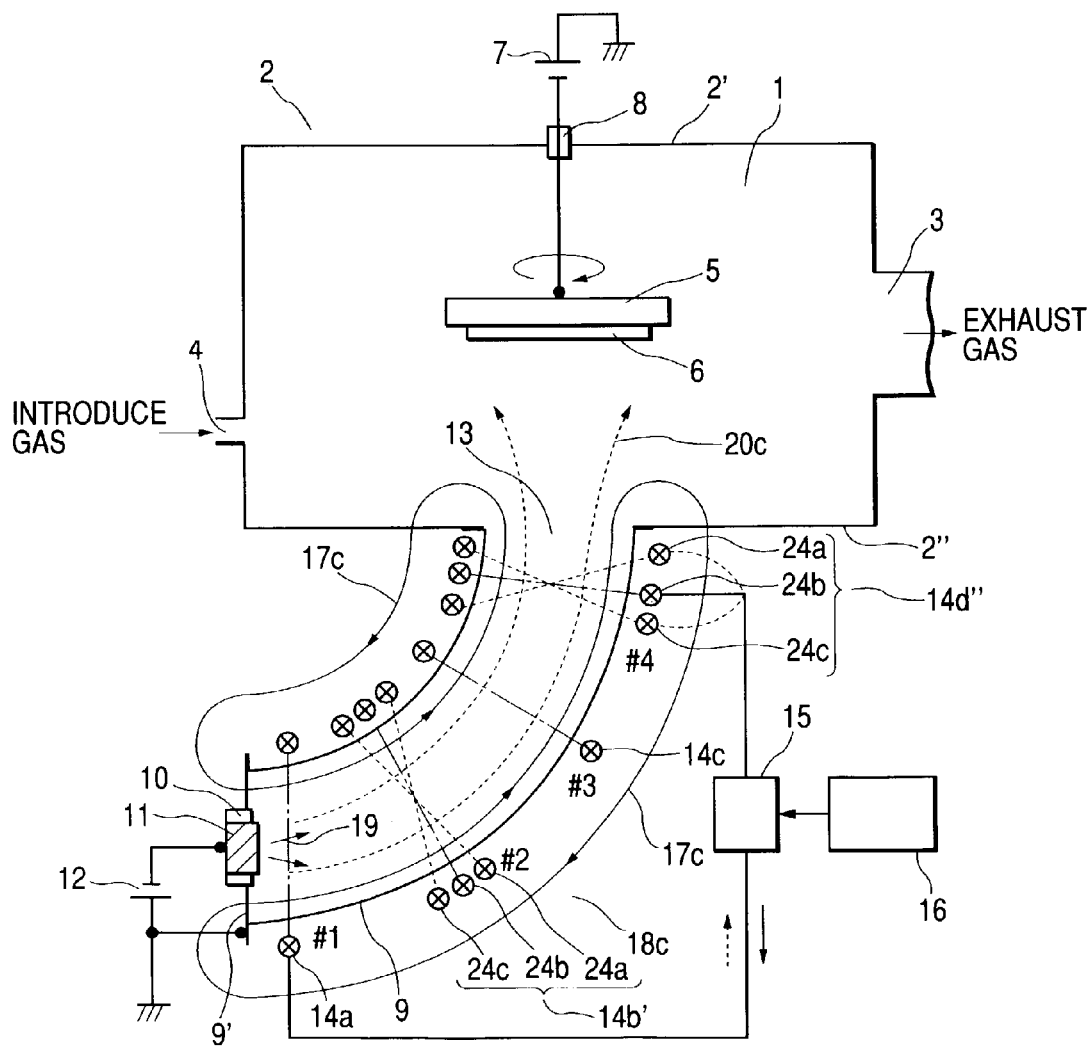
Figure 19:
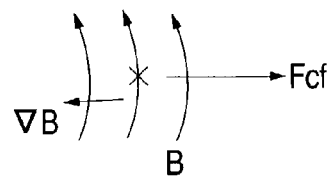
Figure 20:
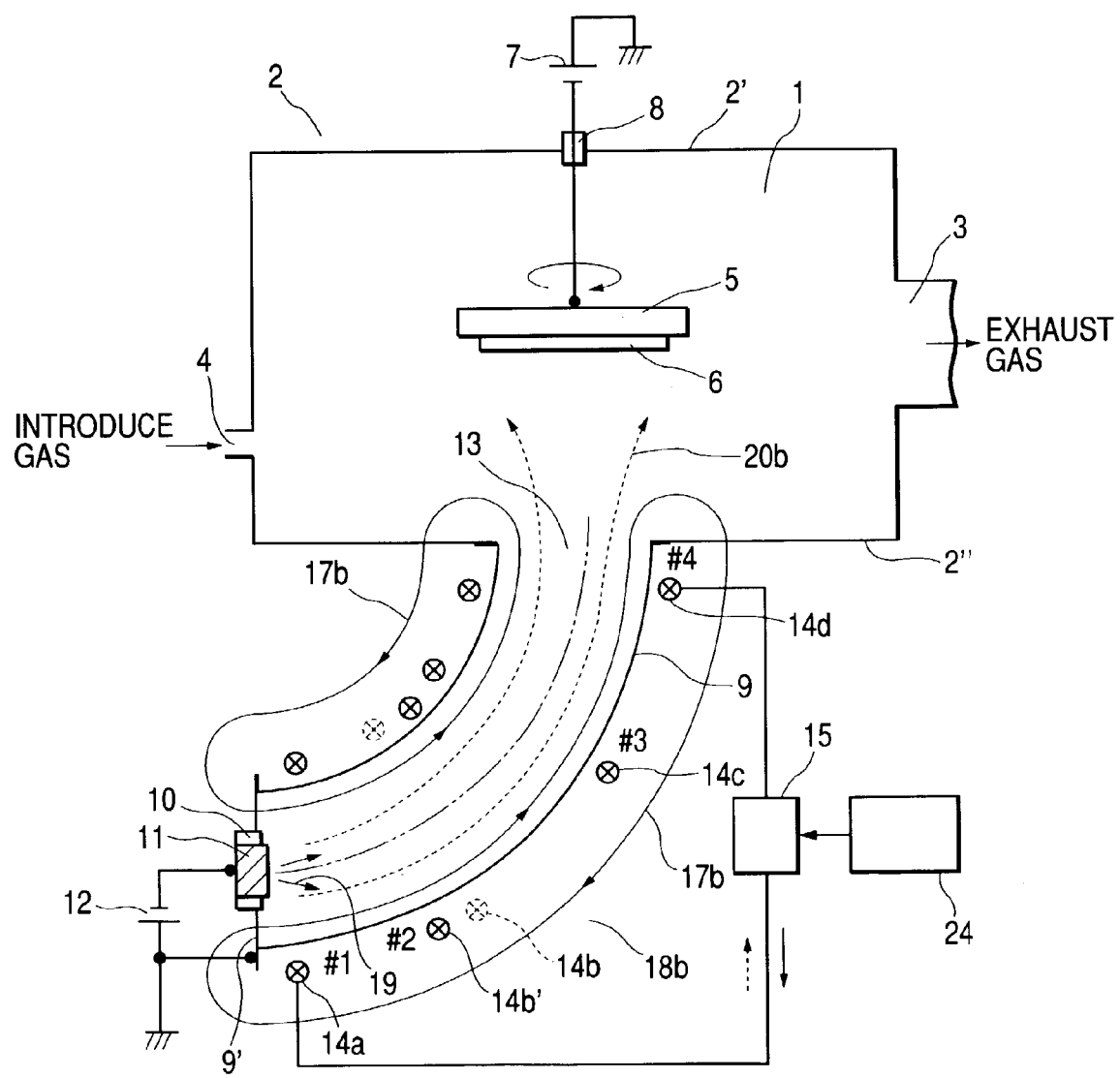
Figure 21:
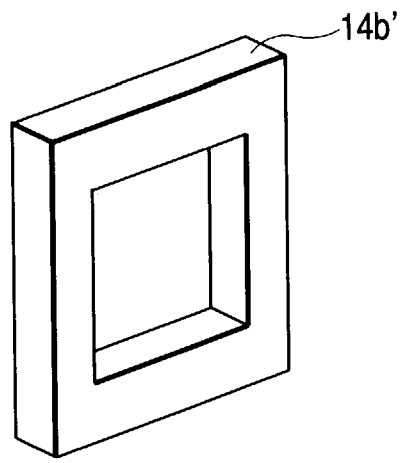
Figure 22A:
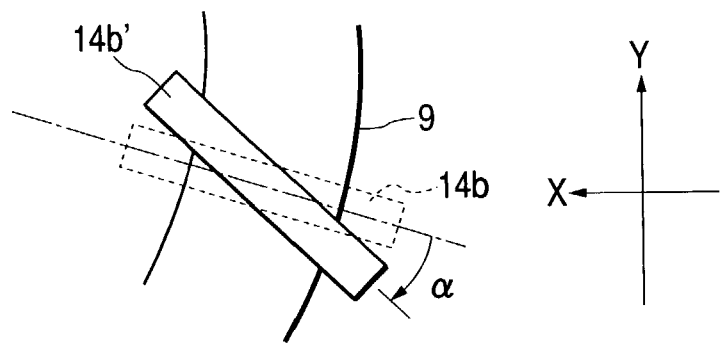
Figure 22B:
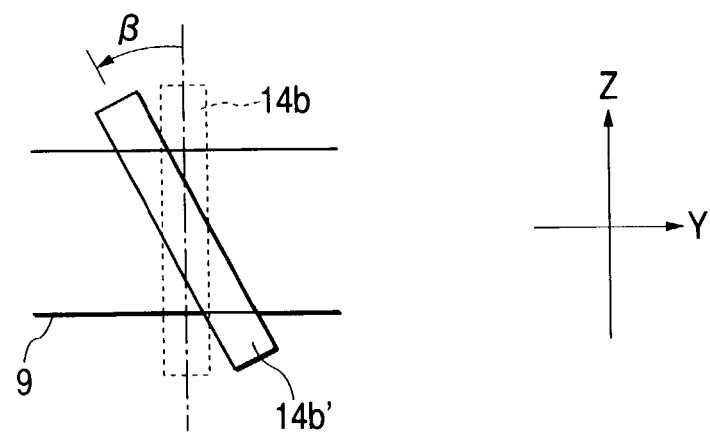
Figure 23A:
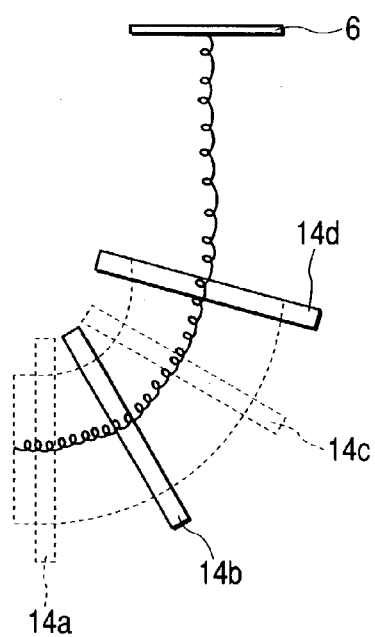
Figure 23B:
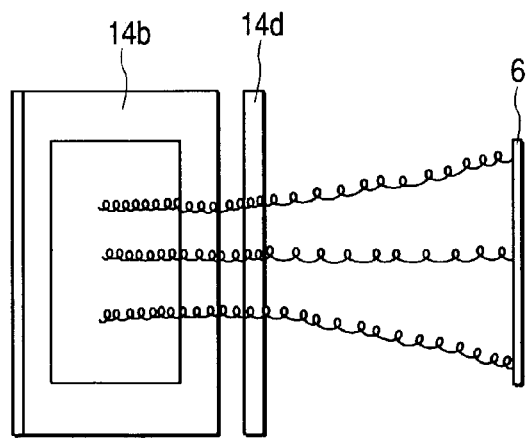
Figure 24:
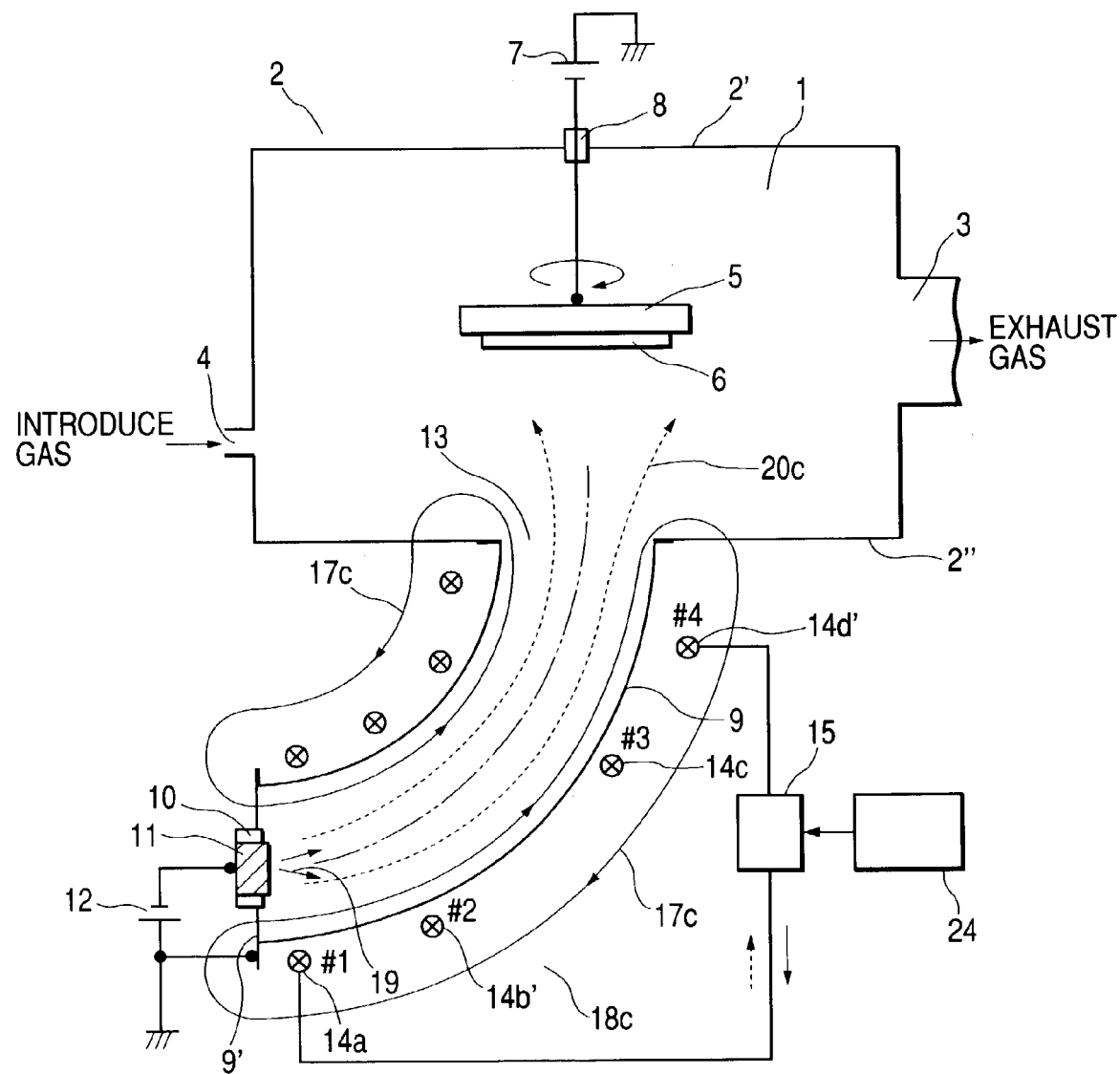
Figure 25:
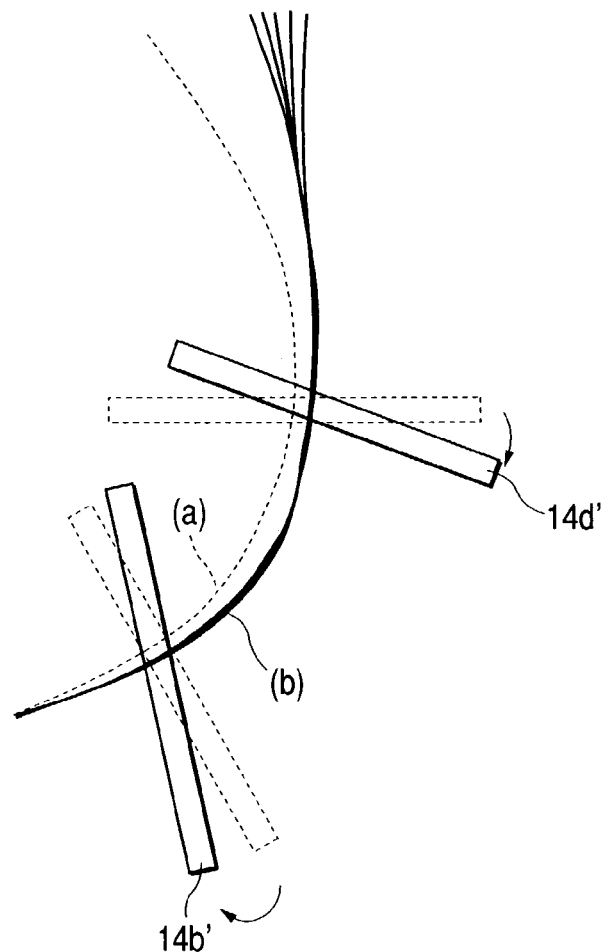
Figure 26:
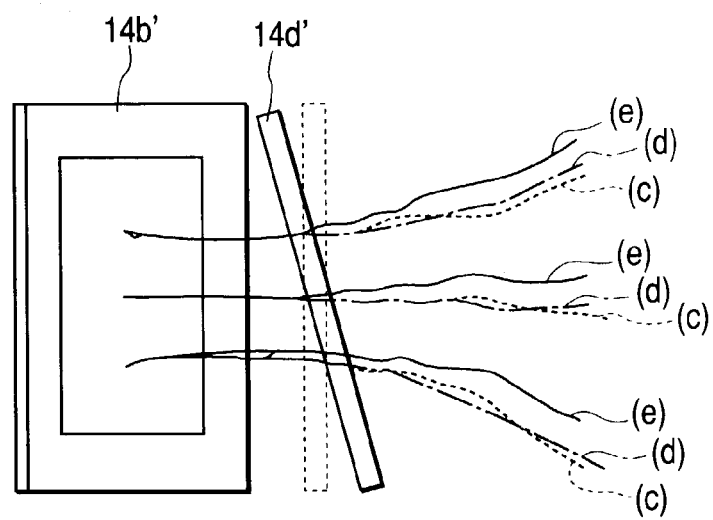
Figure 27:
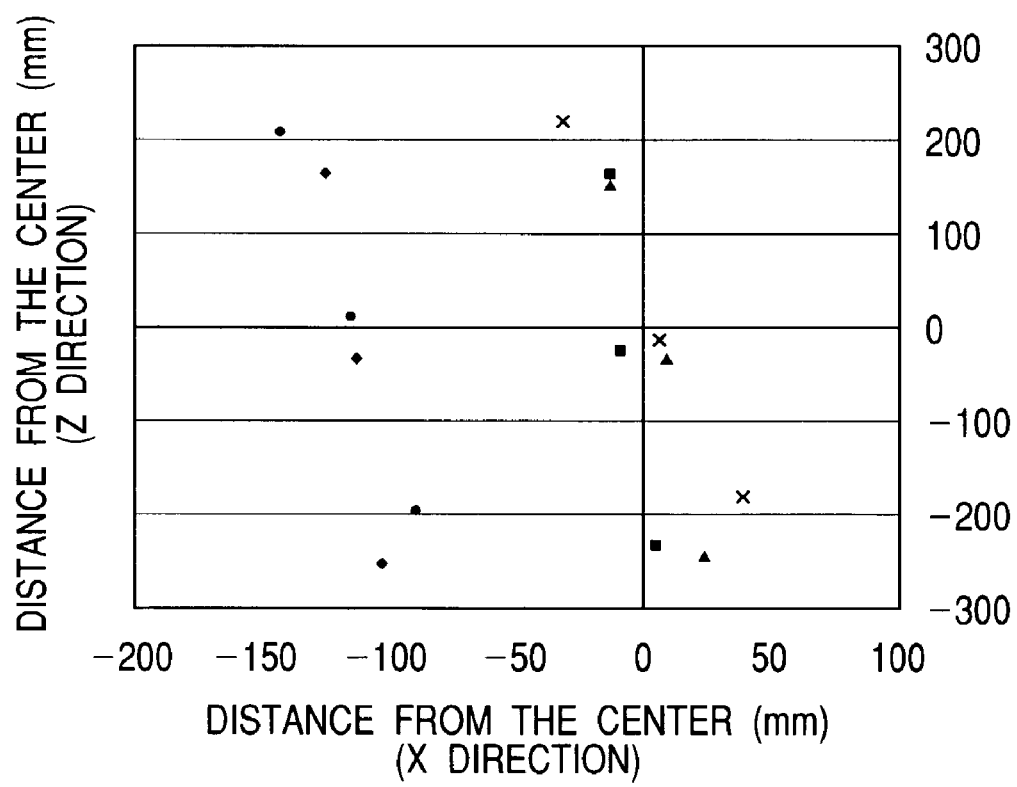

FIG. 10A and ion are a plan view and a right sectional view for explaining a diverging magnetic field of the conventional vacuum arc vapor deposition device of FIG. 9;

FIGS. 11A and 11B are a plan view and a right sectional view respectively for explaining a diverging magnetic field of the conventional vacuum arc vapor deposition device of FIG. 9;

FIG. 12 is a plan view showing a vacuum arc vapor deposition device which an embodiment of the present invention;

FIG. 13 is a perspective view showing a magnetic-field generating coil 1 as a terminal magnet in FIG. 12;

FIGS. 14A and 14B are a plan view and a right side view showing electron paths by the FIG. 12 apparatus;

FIG. 15 is a perspective view showing another magnetic-field generating coil 1 as a terminal magnet in FIG. 12;

FIG. 16 is a perspective view showing yet another magnetic field generating coil 1 as a terminal magnet in FIG. 12;

FIG. 17 is an explanatory diagram for explaining the winding of the electromagnetic coils of the magnetic-field generating coil 1 in FIG. 16;

FIG. 18 is a plan view showing a vacuum arc vapor deposition device which another embodiment of the present invention;

FIG. 19 is a diagram for explaining a drift of charged particles in the FIG. 9 conventional apparatus;

FIG. 20 is a plan view showing a vacuum arc vapor deposition device which is an embodiment of the present invention;

FIG. 21 is a perspective view showing an electromagnetic coil as a specified magnet shown in FIG. 20;

FIGS. 22A and 22B are a plan view and a right side view respectively for explaining an inclination of the electromagnetic coil shown in FIG. 21;

FIGS. 23A and 23B are a plan view and a right side view for explaining electron landing positions by the FIG. 20 apparatus, respectively;

FIG. 24 is a plan view showing a vacuum arc vapor deposition device which is another embodiment of the present invention, respectively;

FIG. 25 is a plan view for explaining electron paths in the FIG. 24 apparatus;

FIG. 26 is a right side view for explaining electron paths in the FIG. 24 apparatus; and FIG. 27 is a graph for explaining electron landing positions on the surface of the surface.

DESCRIPTION OF THE PREFERRED EMBODIMENTS

An embodiment of the present invention will be described with reference to FIGS. 1 through 8.

Figure 1:
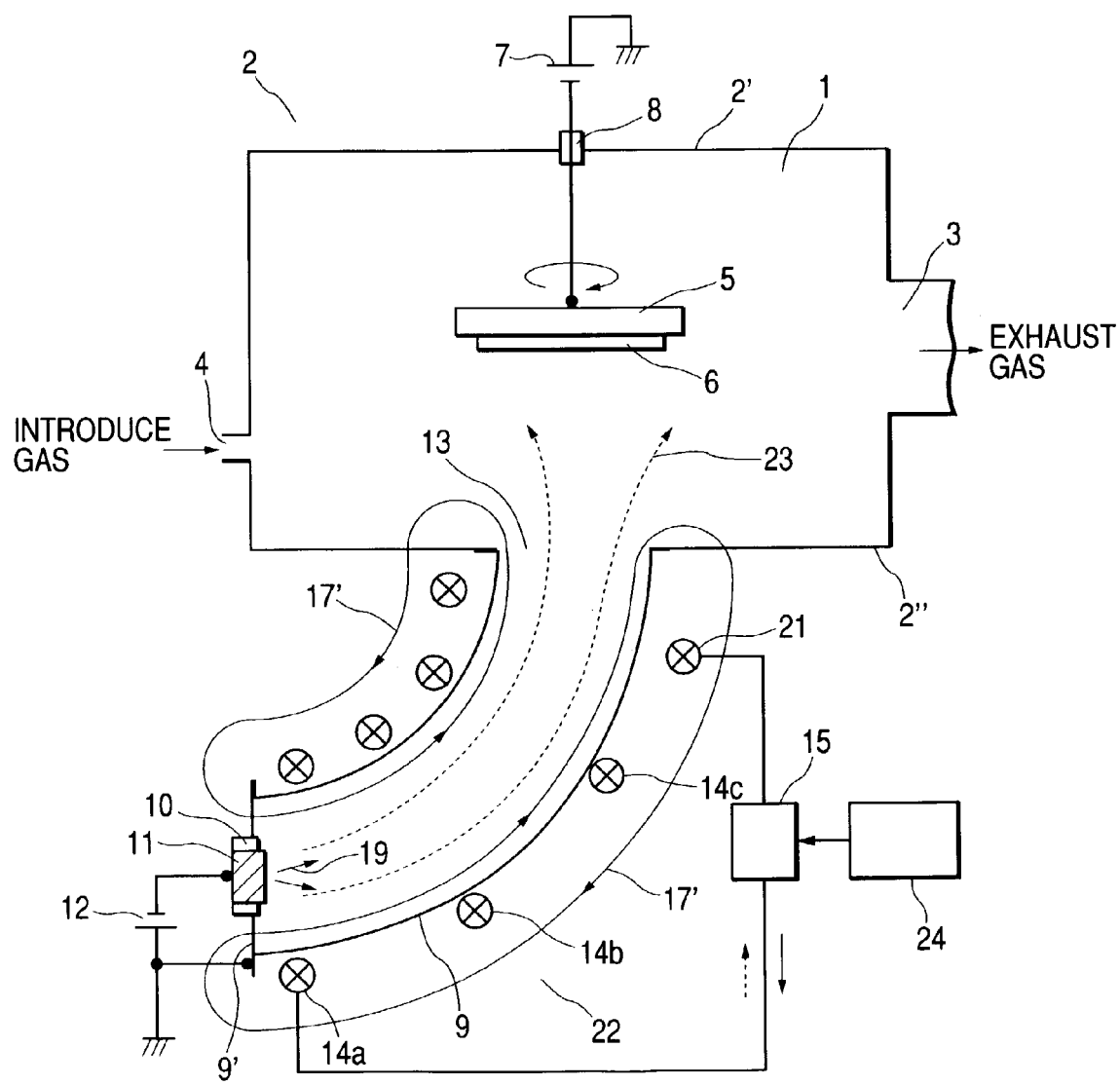
FIG. 1 is a plan view showing a vacuum arc vapor deposition device which an embodiment of the present invention.

FIG. 1 is a plan view showing a vacuum arc vapor deposition apparatus corresponding to that of FIG. 9.

In FIG. 1, an electromagnetic coil 21 is used in place of an electromagnetic coil 14d as the terminal magnet in FIG. 9. The electromagnetic coil 21 is larger than other electromagnetic coils 14a to 14c.

Figure 2:
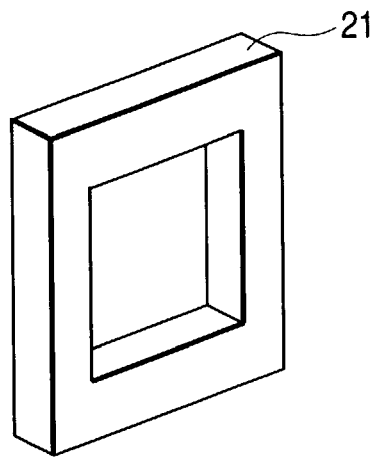
FIG. 2 is a perspective view showing an electromagnet coil as a terminal magnet in FIG. 1.

An electromagnetic coil 21 is shaped like a rectangular frame, as shown in a perspective view of FIG. 2. In a plan view and a right side view showing the electromagnetic coil mounted to the duct in FIGS. 3A and 3B, an X-axis direction represents a horizontal direction ("positive" is assigned to the right side), a Y-axis direction is a front-and-back direction ("positive" is assigned to the back side), and a Z-axis direction is a vertical direction ("positive" is assigned to the upper side). The electromagnetic coil is mounted on the duct in a state that it is inclined, in a plane defined by the X-Y-axes, at an angle $\alpha$ from its broken line attitude parallel to the plasma ejection plane of the plasma injection hole 13, and inclined an angle $\beta$ in a Y-Z plane.

The angles $\alpha$ and $\beta$ are optimumly determined in advance by a charged-particle analysis simulation and a teat vapor deposition process. In the instant embodiment, an angle at which the electromagnetic coil 21 is mounted on the duct 9 was manually adjusted. Is the adjustment, the electromagnetic coil was inclined at the angle $\alpha$ and/or $\beta$ with respect to the plasma ejection surface of the electromagnetic coil 21.

A magnetic field generated by the electromagnetic coil 21 is controlled in accordance with the angle $\alpha$ and/or $\beta$. A magnetic filter 22 of a deflection magnetic field 17', which is different from the deflection magnetic field 17 in FIG. 9, is formed in the vicinity of the plasma injection hole 13. A plasma stream 23 corresponding to the plasma stream 20 in FIG. 9 is generated by the magnetic filter 22.

Figure 4A:
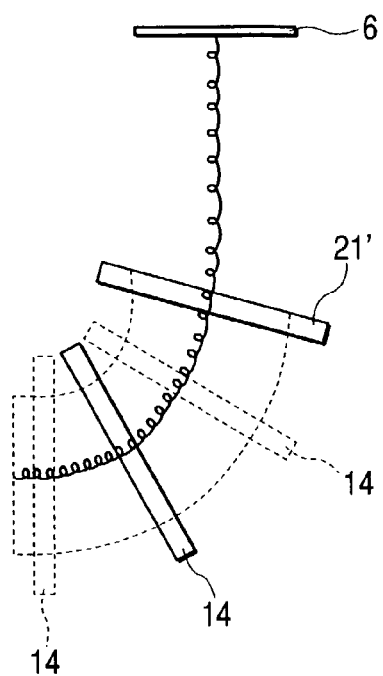
FIGS. 4A and 4B show a plan views and a right side elevation view useful in explaining electron paths respectively when the electromagnet coil as the terminal magnet as a terminal electromagnet coil is inclined at $\alpha=15°$.
Figure 4B:
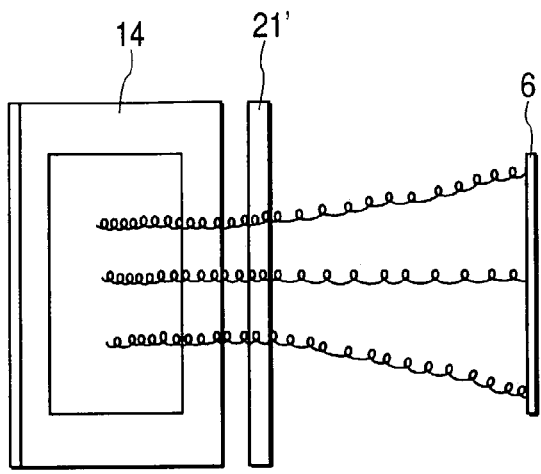

At this time, as shown in a plan view and a right side view showing electron paths in FIGS. 4A and 4B, the electron path pass through the duct 9 and reaches the surface of the substrate 6, is adjusted so that the center position on the substrate at which the electron reaches is substantially coincident with the center of the surface of the substrate 6.

To show the effect by the mounting angle of the electromagnetic coil 21, the electron paths illustrated in FIGS. 4A and 4B were depicted under conditions that the electromagnetic coil 21 was substituted by an electromagnetic coil 21', which is equal in size to that of each of the remaining electromagnetic coils 14. Then the electromagnetic coil 21' was inclined at an angle 15° clockwise, whereby a diversion of the magnetic field in the horizontal directions was corrected by conversion. As in the case of FIGS. 11A and 11B, current is provided with only the two electromagnetic coils 21' and 14, viz., every other electromagnetic coil of those electromagnetic coils.

The size of the electromagnetic coil 21 is different from that of each of the remaining electromagnetic coils 14, and In the instant embodiment, the electromagnetic coil 21 is larger than the remaining electromagnetic coils 14 to suppress the diverging of the magnetic field in the vertical directions.

Figure 5A:
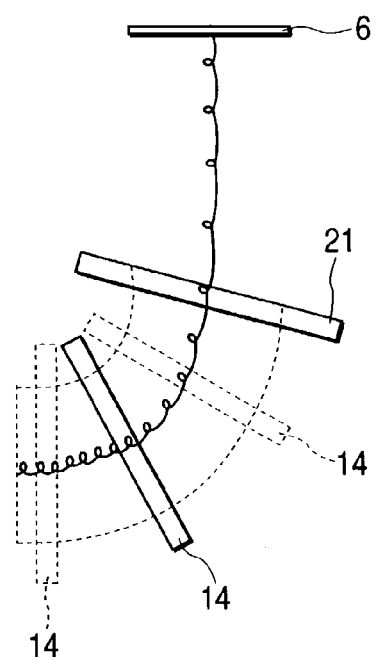
FIGS. 5A and 5B are a plan view and a right sectional view each useful in explaining electron paths respectively when the electromagnet coil as the terminal magnet is inclined at $\alpha=15°$ and the size of the electromagnet coil is larger than that of the electromagnet coil of another magnet.
Figure 5B:
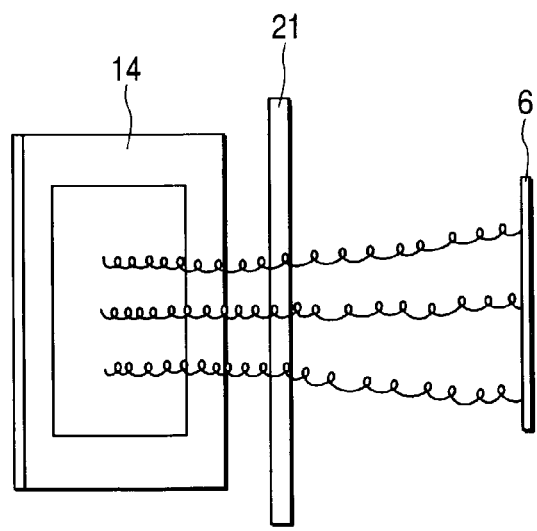

If the electromagnetic coil 21 is larger than that of each of other electromagnetic coils 14, it has an additional function of focusing the magnetic field in the vertical direction. With the additional function, the magnetic field is converted for correction in the vertical direction. As shown in a plan view and a right side view of FIGS. 5A and 5B showing electron paths, the electron paths as viewed in the vertical directions are corrected toward the center of the surface of the substrate 6. This fact was confirmed by our experiment.

Electron paths illustrated in FIGS. 5A and 5B were depicted under conditions that the mounting angle $\alpha$ of the electromagnetic coil 21 was 15° when it is inclined clockwise, and the size of the electromagnetic coil was 120% of that of each of other electromagnetic coils 14. As in the case of FIGS. 4A and 4B, current is provided with only the two electromagnetic coils 21 and 14, viz., every other electromagnetic coil of those electromagnetic coils.

As seen from FIGS. 4A, 4B, 5A, and 5B, the electron paths are corrected toward the center of the surface of the substrate 6 in both the vertical and horizontal directions. Therefore, the offsets of the landing positions of the ions of the cathode material 19 on the substrate surface in the vertical and horizontal directions (those ion landing position offsets will be referred to as vertical and horizontal offsets), and the diversion of the ions are corrected toward the center on the substrate. As a result, a film is formed uniformly over the surface of the substrate 6.

Specific experiment results will be given below.

The center of the plasma injection plane of the plasma injection hole 13 was aligned with that of the surface of the substrate 6 in a state that those were separated from each other a distance of 400 mm. Coil current of 100 A was fed to the electromagnetic coils 21 and 14. The mounting angle $\alpha$ of the electromagnetic coil 21 was set at 15°, 20° and 25° with the electromagnetic coil being inclined to the clockwise direction. The offsets of positions on the surface of the substrate 6 at which electrons having traveled along their paths land, from the center of the surface of the substrate 6 in the right and left directions (horizontal directions) and in the up and down directions (vertical directions) were as shown in FIG. 6.

Figure 6:
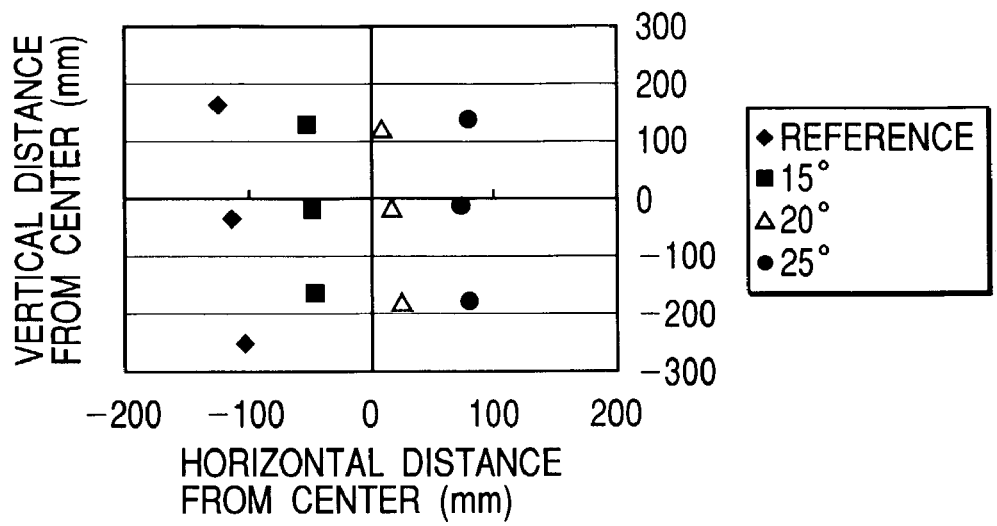
FIG. 6 is a table showing the results of measured values of electron arrival positions when an angle $\alpha$ of the electromagnet coil as the terminal coil is varied is varied.

In FIG. 6, a mark ♦ indicates an offset of the electron path by a reference (reference coil) when $\alpha=0°$, and marks ■, Δ and ● are offsets of the electron path respectively when $\alpha=15°$, 20° and 25°.

Figure 7:
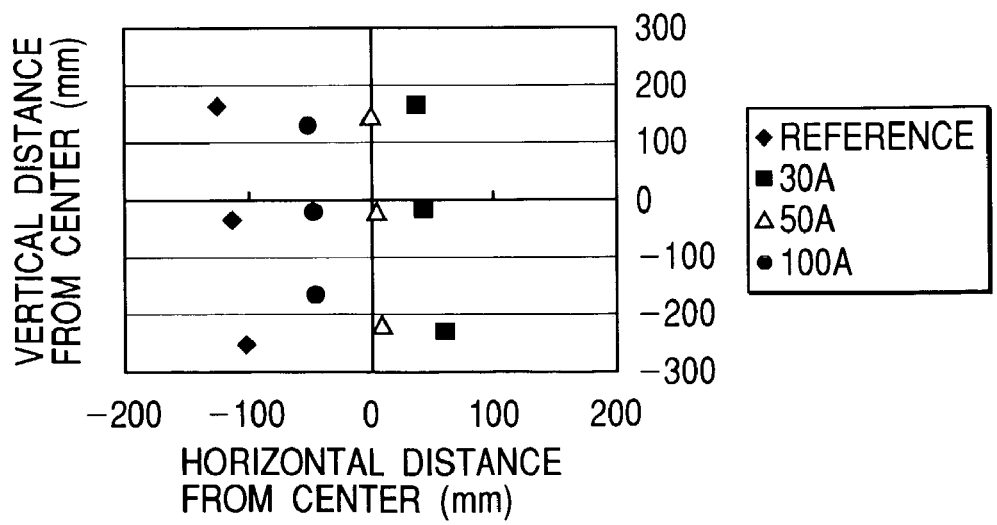
FIG. 7 is a table showing the results of measured values of electron arrival positions when the electromagnet coil as the terminal coil is inclined by an angle $\alpha=-15°$ and the coil current is varied.

When $\alpha=15°$ and coil current was set at 30 A, 50 A and 100 A, the electron path offsets were as shown in FIG. 7.

In FIG. 7, a mark ♦ indicates an electron path offset by the reference when $\alpha=0°$ and the coil current was 50 A, and marks ■, Δ and ● are offsets respectively when $\alpha=15°$ and the coil current was set at 30 A, 50 A and 100 A.

As seen also from FIGS. 6 and 7, if the mounting angle α is appropriately selected in accordance with the coil current, and the electromagnetic coil 21 is appropriately inclined to the plasma injection plane of the plasma injection hole 13, then the electron landing positions on the surface of the substrate 6, particularly in the horizontal directions are corrected to the center of the substrate 6. As a result, the cathode material 19 is deposited at the central part of the surface of the substrate 6.

Figure 8A:
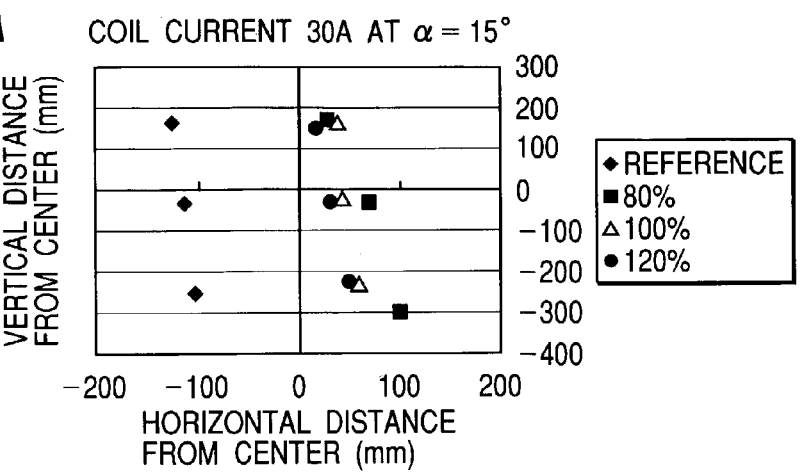
FIGS. 8A, 8B and 8C are tables showing the results of measured values of electron arrival positions for coil size difference when the electromagnet coil as the terminal coil is inclined by an angle $\alpha=15°$ and the coil current is varied to 30 A, 50 A and 100 A.
Figure 8B:
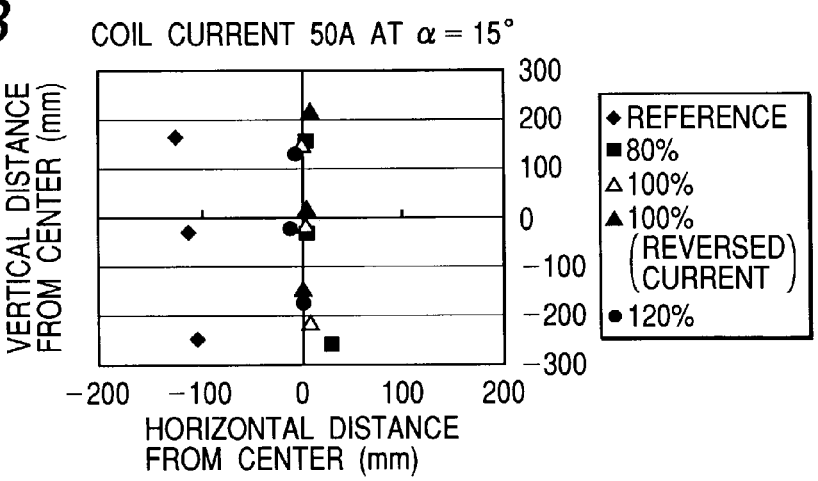
Figure 8C:
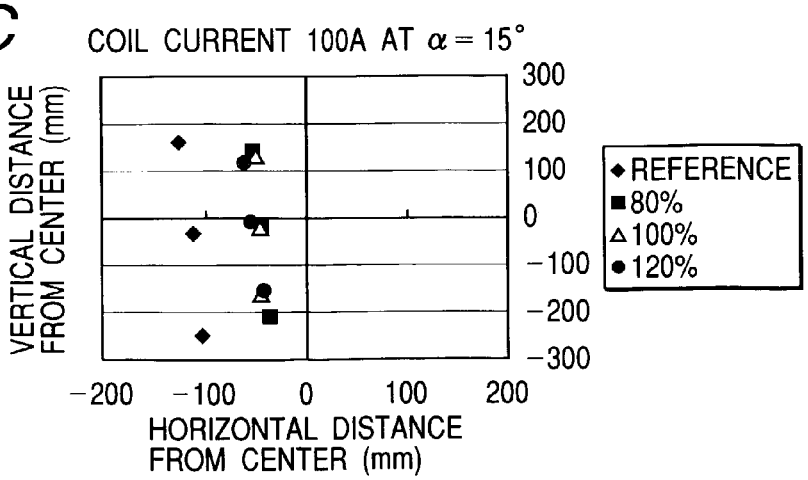

The results as shown in FIGS. 8A, 8B and 8C were obtained under conditions that α=15°, the coil current=30 A, 50 A and 100 A, and the size of the electromagnetic coil 21=80%, 100% and 120%.

In FIGS. 8A, 8B and 8C, ♦ indicates offsets of the electron landing positions by the reference when α=0° and the size of the electromagnetic coil=100%. ■, ∆ and ● are offsets of the electron landing positions when α=15° and the size of the electromagnetic coil=80%, 100% and 120%.

▲ in FIG. 8B, as in the case of ∆, indicates offsets of electron landing positions when α=15°, and the size of the electromagnetic coil=100%, and the coil current direction is reverse to that in the case of other offsets.

As seen also from FIGS. 8A, 8B and 8C, if the size of the electromagnetic coil 21 is set at 120%, the diversion of the magnetic field is suppressed to thereby correct the electron landing position or the vertical directions to the center of the substrate 6. Accordingly, the cathode material 19 is more excellently deposited at the central part of the surface of the substrate 6, and a uniform formation is ensured.

Thus, in the instant embodiment, the electromagnetic coil 21 as the terminal magnet is inclined at the angle α and/or β with respect to the plasma injection plane of the plasma injection hole 13, and the electromagnetic coil 21 is selected to be larger than each of other electromagnetic coils 14. Accordingly, the traveling of the ions of the cathode material 19 are controlled in the vertical and horizontal directions to correct the electron landing positions to the center of the substrate surface. The cathode material 19 is vapor deposited at the central part of the surface of the substrate 6, and hence a thin film is formed uniformly over the surface of the substrate 6.

In the embodiment mentioned above, the cathode material 19 is vapor deposited at the central part of the surface of the substrate 6 to correct the electron landing positions to the center of the substrate surface. In some type of substrate 6, it is required to deposit the cathode material at a location apart from the central part of the substrate surface.

In such a case, the angles α and/or β are set at values in accordance with use purposes, and a desired position on the surface of the substrate 6 may be selected for the deposition.

In the embodiment described above, the electromagnetic coil 21 is manually inclined at angle α and/or β. In an alternative, means for varying the mounting angle of the electromagnetic coil 21 is provided, and it includes a jig for varying the angle α by turning the electromagnetic coil 21 in an X—X plane, and another jig for varying the angle β by turning the electromagnetic coil 21 in a Z-Y plane are provided. One of the jigs or both the jigs are used for varying the mounting angle of the electromagnetic coil. The mounting angle of the electromagnetic coil 21 is initially set on the basis of the results of test film formation already made by using the mounting angle varying means. If required, the mounting angle of the electromagnetic coil 21 may be varied during an actual vapor deposition, by using the same.

In the embodiment described above, the terminal magnet and remaining magnets are all formed with the electromagnetic coils 21 and 14. Those magnets may be formed with permanent magnets.

In the embodiment described above, the single evaporating source 11 is employed for ease of explanation. In a case where the substrate 6 has a large area or plural kinds of cathode materials are deposited concurrently, a plurality of evaporating sources 11 may be provided in a vertical array.

It is practical, and in the light of film forming work efficiency, it is preferable to automatically set the mounting angle of the terminal magnet by use of automatic control means, which is formed by a sequence control, a program control or the like in the control unit 24 in FIG. 1, and automatically controls both the jigs in accordance with the result of measuring the film thickness on the surface of the substrate 6 by a thickness meter (not shown) previously or with progress of an actual film forming process, or to automatically vary the mounting angle of the electromagnetic coil during the film forming process.

In a case where the magnets are formed with electromagnetic coils 14 and 21, the coil current of the electromagnetic coils 14 and 21 may be controlled in accordance with the measurement result of the thickness meter by use of current feed control means of the control unit 24 during the film forming process in connection with the control of the mounting angles α and β of the electromagnetic coil 21. If so done, more accurate film formation is secured.

If the direction of the coil current of the electromagnetic coils 14 and 21 may be reversed at fixed time intervals by the current feed control means of the control unit 24, the direction of the magnetic field B is inverted, while the direction of the gradient ∇B of the magnetic field B remains unchanged. As a result, a drift velocity changes which acts on the transportation of the plasma stream 23, and the direction of a traveling of the cathode material 19 toward the surface of the substrate 6 changes. As a result, the film distribution is further uniform, ad hence the film formation characteristic is further ameliorated.

If the coil current to the electromagnetic coils 21 and 14 is fed from an AC power source, the direction of the coil current to the electromagnetic coils 21 and 14 may be reversed at fixed time intervals without the aid of the current feed control means.

In the embodiment described above, the cross section of the duct 9 is rectangular, but it may be circular, elliptical or the like. In this case, the cross section of each magnet is preferably circular, elliptical or the like in conformity with the cross sectional configuration of the duct 9.

In the vacuum arc vapor deposition apparatus of the embodiment described above, the single duct 9 is connected to the vacuum vessel 2. Alternatively, a plurality of ducts are connected to the vacuum vessel 2, and the terminal magnets of those ducts are inclined with respect to the plasma injection plane of the plasma injection hole.

For simplicity of explanation, one holder 5 is located within the film forming chamber 1, and a thin film is formed on one substrate 6 by vapor deposition. It is evident that the present invention may be applied to a case where the vacuum arc vapor deposition is applied to a plurality of substrates as in the arc type ion plating apparatus disclosed in the publication already referred to: a cylindrical, rotary holder is provided within the film forming chamber, and a plurality of substrates are held on the surfaces of the holder.

In the embodiment, the electromagnetic coil 21 is larger than the remaining electromagnetic coils 14, and hence, the terminal magnet is larger than the remaining magnets. In some film forming conditions, for example, a distance between the plasma injection hole 13 and the substrate 6 is short, even if the terminal magnet is smaller than the remaining ones, good film forming characteristics are obtained sometimes. In such a case, the termination magnet may be selected to be smaller than the remaining ones, as a matter of course.

While the above-mentioned embodiment employs the curved duct 9, the present invention may be applied to a case where a bent duct is used instead.

To further improve the film forming characteristic, the mounting angle of the termination magnet (electromagnetic coil 21) is adjusted in the horizontal and/or vertical direction, and further some or all the remaining magnets (electromagnetic coil 14) are adjusted in the mounting angle in the horizontal and/or vertical direction as the termination magnets so done.

As seen from the foregoing description, the present invention hag the following effects.

In a vacuum arc vapor deposition process of the first aspect of the invention, the terminal magnet (electromagnetic coil 21) located closest to the plasma injection hole 3 is disposed inclined to a plasma injection plane of the plasma injection hole 13, and traveling directions of the ions of the cathode material 19 are controlled by a magnetic field generated by the terminal magnet. With this feature, unlike the conventional case where the terminal magnet is parallel to the plasma injection plane in the conventional art, under a magnetic field developed by the terminal magnet, ions of cathode material 19 travel and land at the central part on the surface of the substrate 6, whereby a uniform film formation by vapor deposition is secured.

By setting the mounting angle of the terminal magnet at appropriate values, ions of the cathode material 19 land at a target position on the surface of the substrate. As a result, a vapor deposited thin film can be formed at desired film forming characteristics.

In the invention, the mounting angle of the terminal magnet is variable. Therefore, the mounting angle of the terminal magnet may be varied before and during the film forming process. Accordingly, vapor deposited thin films of various film forming characteristics can be formed as desired.

In the vacuum arc vapor deposition process of the third aspect of the invention, the terminal magnet is larger than that of each of other magnets. Therefore, the diverging magnetic field of the terminal magnet, in particular its vertical diversion a variously be controlled by varying the size of the terminal magnet. For example, if the terminal magnet is larger than each of the remaining magnets, the vertical diversion of the magnetic field is suppressed in high level, and the film is more uniformly formed with more excellent film forming characteristics.

And it is practical and preferable that the magnets are electromagnetic coils 14 and 21. Further, it is preferable that the mounting angle of the terminal magnet is automatically controlled.

To secure satisfactory film forming characteristics, it is preferable that each magnet consists of an electromagnetic coil 14 (21), and coil current fed to the electromagnetic coil 14 (21) of the magnet is controlled in connection with the control of the mounting angle of the terminal magnet.

If a plurality of evaporating sources 11 is used, the film forming ability is improved, and concurrent film formation can b performed by using a plural kinds of cathode materials 19 may be used for film formation.

The direction of the coil current fed to each electromagnetic coil 14 (21) forming each magnet may be reversed at fixed time intervals. If so done, the landing positions of the ions of the cathode material 19 are periodically shifted, and consequently, a film is formed uniformly over a substrate 6 of a large area.

Vacuum arc vapor deposition apparatus described above provides a specific means for executing each vacuum arc vapor deposition process.

Another preferred embodiments of the present invention will be described with reference to FIGS. 12 through 18.

FIG. 12 is a plan view showing a vacuum arc vapor deposition apparatus corresponding to that shown in FIG. 9, and like reference numerals designate like or equivalent portions in FIG. 9.

In FIG. 12, a magnetic field generating coil 14d' formed with three electromagnetic coils 21a, 21b and 21c is provided at a location where the magnetic-field generating coil 14d' as the terminal magnet in FIG. 9.

The electromagnetic coils 21a, 21b and 21c of the magnetic field generating coil 14d', as perspectively shown in FIG. 13, are rectangular shaped coils of different sizes (diameter) and plural turns. In FIG. 2, the electromagnetic coils 21a, 21b and 21c are different from one another, and large, medium and small in size, respectively. The electromagnetic coil 21b is fit into the electromagnetic coil 21a, and the electromagnetic coil 21c is fit into the electromagnetic coil 21b.

In FIG. 12, the directions of the cross sections of the duct 9 at the magnetic-field generating coils 14a to 14c and 14d' are indicated by one-dot chain lines a, b and c. If the directions are R-axis directions, two planes perpendicular to each of those cross sections are a horizontal plane containing the R-axis and a vertical plane containing a Z-axis extending in the up and down directions.

A one-dot chain line extending in the right and left directions in FIG. 13 indicates the R-axis, and a one-dot chain line extending in the up and down directions indicates a Z-axis. The electromagnetic coils 21a, 21b and 21c are disposed such that in the horizontal plane those coils are angularly differently spaced about the Z-axis, and surround the duct 9 while being inclined at different angles to the duct.

In FIG. 13, the electromagnetic coil 21b is parallel to the cross section of the duct (inclination angle=0). The electromagnetic coils 21a and 21c are angularly spaced from the electromagnetic coil 21b by preset angles in the horizontal plane.

One electromagnetic coil is selected from among those electromagnetic coils 21a, 21b and 21c manually or by a sequential control (movement select). The selected electromagnetic coil is connected to a power feeding loop of a coil power source 15. Then, the selected electromagnetic coil is fed with current.

In this case, a magnetic field characteristic of a magnetic filter 18b in FIG. 12, which is formed by a deflection magnetic field 17b as developed by the magnetic-field generating coils 14a to 14c, 14d, is adjusted. Then, the adjusted magnetic field characteristic is set and controlled by feeding current selectively to the electromagnetic coils 21a, 21b and 21c of the magnetic-field generating coil 14d', as in the case where the magnetic-field generating coil 14d' in the conventional apparatus is rotated in a horizontal plane by the rotary mechanism.

And, a plasma stream 20b corresponding to the plasma stream 20a in FIG. 8 is generated by the magnetic filter 18b.

Figure 3A:
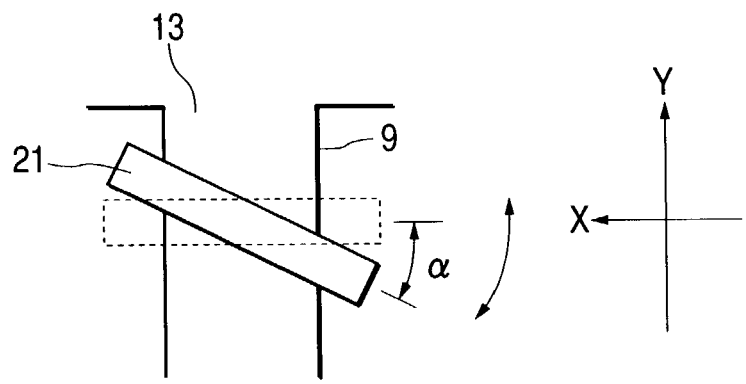
FIGS. 3A and 3B are explanatory diagrams for explaining an inclination of the electromagnet evil of FIG. 2.
Figure 3B:
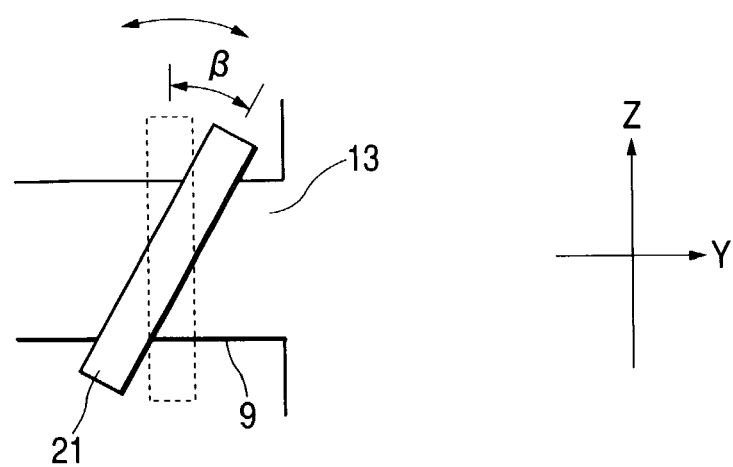

As seen from a plan view and a right side view showing electron paths in FIGS. 3A and 3B, the paths of electrons that pass through the duct 9 and reach the surface of the substrate 6 are corrected by the electromagnetic coil 14' so that the center of the electron landing positions is aligned with the center of the surface of the substrate 6.

FIGS. 14A and 14B show electron paths traced when current is fed to only the two electromagnetic coils 14b and 14d' indicated by solid lines, viz, for the purpose of showing the effect by the mounting angle of the magnetic-field generating coil 14d'.

Accordingly, without providing complicated and expensive rotary mechanism and the like, the magnetic field characteristic of the magnetic filter 18a may be set and controlled easily and with simple and inexpensive construction, and hence, the film forming characteristic and the like is improved.

When the magnetic-field generating coil 14d' is formed by combining the electromagnetic coils 21a, 21b and 21c having different coil sizes as shown in FIG. 2, it is easily formed by fitting the small electromagnetic coil into the large one.

The electromagnetic coils 21a, 21b and 21c may be electromagnetic coils having equal or substantially equal coil sizes.

When the magnetic-field generating coil 14d' is formed by combining a plurality of electromagnetic coils having equal coil size, electromagnetic coils 22a, 22b and 22c of equal size, as perspectively shown in FIG. 15, are need in place of the electromagnetic coils 21a, 21b and 21c of different coil sizes in FIG. 13.

Those electromagnetic coils 22a, 22b and 22c are arranged such that the coil 22b is placed on the coil 22c, and the coil 22a is placed on the coil 22 at the upper and lower crossing points A and B. Also at the lower crossing point B, the coil 21b is placed on the coil 21c. Thus, those coils are crossed every coil.

When the magnetic-field generating coil 14d' is formed with a plurality of electromagnetic coils having equal coil size, electromagnetic coils 23a, 23b and 25c of equal size, which are formed in an integral form, as perspectively shown in FIG. 15, are used in place of the electromagnetic coils 21a, 21b and 21c in FIG. 2.

In this case, the electromagnetic coils 23a, 23b and 23c, as their parts are enlargedly illustrated in FIG. 16, are integrally coupled together such that a winding ta of the coil 23a, a winding of the coil 23b and a winding to of the coil 23c are wound one on another, viz., by weaving those windings. Those coils are substantially equal in size.

In a case where the magnetic-field generating coil 14d' is formed with the electromagnetic coils 22a to 22c (23a to 23c) of which the coil sizes are equal or substantially equal, the magnetic fields generated those coils 22a to 22c (23a to 23c) are substantially equal. Accordingly, the setting and control of the magnetic field characteristic are easy.

In the embodiment, the electromagnetic coils 21a, 21b and 21c (22a to 22c, 23a to 23c) of the magnetic-field generating coil 14d' are inclined at different angles in the horizontal plane about the X-axis in order to suppress the diversion of the electrons and ions in the right and left directions. To suppress the diversion of the electron and ions mainly in the up and down directions, it may be performed to only form the magnetic-field generating coil 14d' with a plurality of electromagnetic coils, which are inclined at different angles in the vertical plane about the R-axis.

Another embodiment of the present invention will be described with reference to FIG. 18.

FIG. 18 is a plan view showing a vacuum arc vapor deposition device which another embodiment of the present invention, and like reference numerals designate like or equivalent portions in FIG. 12. In the case of FIG. 18, a #4 electromagnetic coil 14", which is formed with electromagnetic coils 24a to 24d is used in place of the magnetic-field generating coil 14d' in FIG. 12. Further, the magnetic-field generating coil 14b in FIG. 12 is substituted by a #2 magnetic-field generating coil 14b', which is formed with electromagnetic coils 25a to 25c.

To accurately suppress a horizontal diversion of electrons and ions, the electromagnetic coils 24a to 24c, and 25a to 25c, like the electromagnetic coils $^{21}$a to 21c, 22a to 22c, 23a to 23c, may be inclined at different angles in the horizontal plane about the Z-axis. To accurately suppress a vertical diversion of electrons and ions, those electromagnetic coils may be inclined at different angles in a vertical plane about the R-axis.

Further, if required, one of the electromagnetic coils 24a to 24c and the electromagnetic coils 25a to 25c is inclined in the horizontal plans. The other of them 24a to 24c and 25a to 25c is inclined in the vertical plane. By so doing, the horizontal and vertical diversions of electron and ions are suppressed.

It is evident that the electromagnetic coils 24a to 24c, 25a to 25c may also have different sizes as shown in FIG. 13, or have equal or substantially equal coil size as shown in FIGS. 15 and 16.

One electromagnetic coil selected from those electromagnetic coils 24a to 24b, 25a to 25c is connected to the power feeding loop of the coil power source 15, and a magnetic filter 18c defined by a deflection magnetic field 17c is formed. And, a plasma stream 20c corresponding to the plasma stream 20b in FIG. 12 is generated. A thin film is formed on the surface of the substrate 6, with extremely excellent film forming characteristic.

It will be readily understood that configurations and structures of the duct, magnetic filter and others, and the number of magnetic-field generating coils, locations at which the magnetic-field generating coils are installed may be different from those in the embodiments described above.

One or more number or magnetic-field generating coils forming the magnetic filter may be formed with a plurality of electromagnetic coils like the electromagnetic coils 21a to 21c, 25a to 25c, as a matter of course. In this case, the number of electromagnetic coils is at least two, and the inclining direction of the magnetic-field generating coil may be different with the magnetic field generating coil.

It is evident that the configuration and winding of each electromagnetic coil of each magnetic-field generating coil are not limited to those in the embodiments described above.

It is not essential that the magnetic-field generating coils have equal coil size. For example, in FIG. 1, the electromagnetic coils 21a to 21c of the #4 terminal magnetic-field generating coil 14d' may be larger in size than those of the magnetic-field generating coils 14a to 14c, and the magnetic-field generating coil 14d' may be larger in diameter than the remaining magnetic-field generating coils 14a to 14c. If so done, the diversion of electrons and ions is further suppressed.

Further, the invention may be applied to various types vacuum arc vapor deposition apparatus having magnetic filters.

As seen from the foregoing description, the present invention has the following effects.

At least of magnetic-field generating coils 14a to 14c, and 14d', 14a, 14b', 14c, 4d'', which form a magnetic filter 18b, 18c, is formed with a plurality of electromagnetic coils 21a to 21c, 25a to 25c which are inclined at different angles with respect to the cross section of a duct 9, while surrounding the duct 9. The electromagnetic coils 21a, 21b and 21c, to 25a to 25c are selectively energized by current as fed, depending on the setting and controlling of the magnetic field of the magnetic filter. A magnetic field of the magnetic filter 18b, 18c may be adjusted to a desired characteristic without actually moving the magnetic-field generating coil. There is no need of providing a complicated, expensive rotary mechanism for circularly moving the magnetic-field generating coil. Accordingly, the magnetic field characteristic of the magnetic filter 18b, 18c is set and controlled and with simple and inexpensive construction to thereby form a uniform thin film on the substrate 6, and hence, the film forming characteristic and the like is improved.

The plurality of electromagnetic coils surrounding said duct are provided while being inclined at different angles in one of two planes perpendicular to the cross section of said duct. Therefore, the vacuum arc vapor deposition apparatus may be realized with a practical construction.

When the electromagnetic coils 21a to 21c, 25a to 25c are different in coil size, the magnetic-field generating coils 14b', 14d', 14d" can be formed easily. When those coils are equal or substantially equal in coil size, there is no difference of magnetic field intensity among those electromagnetic coils 21a to 21c. The setting and controlling of the magnetic field characteristic are easy.

Another preferred embodiments of the present invention will be described with reference to FIGS. 20 through 27.

A embodiment of the present invention will be described with reference to FIGS. 20 through 23.

FIG. 20 is a plan view showing a vacuum arc vapor deposition apparatus corresponding to that shown in FIG. 9, and like reference numerals designate like or equivalent portions in FIG. 9.

In the invention, one or more magnets closer to one end of a duct 9 (or evaporating source 11) than the terminal magnet surrounding the duct 9 is used as a specified magnet. In the embodiment, a second (#2) magnet counted from the evaporating source 11 is a specified magnet.

An electromagnetic coil of the specified magnet is formed with an electromagnetic coil 14b', indicated by a solid line, which is actively inclined at a desired angle to the cross section of the duct 9, not a conventional electromagnetic coil 14b, indicated by a broken line, which is oriented in the direction of the cross section of the duct 9.

A two-dot chain line indicates an extending direction of the duct 9. A cross sectional plane of the duct 9 is perpendicular to the extending direction at each of respective positions. The cross sectional plane extends in the direction of a normal line passing through the center of curvature at a curved part.

The electromagnetic coil 14b' located at a curved part of the duct 9, like other electromagnetic coils 14a, 14c and 14d, is also rectangular in shape as perspectively shown in FIG. 21, and the electromagnetic coil thus shaped is wound around the duct by plural turns.

As shown in a plan view showing a duct mounting state in FIG. 22A, one dot chain line passing through the center of curvature of the duct 9 is coincident with the cross sectional plane direction or the duct 9 in an X-Y plane (horizontal plane) defined by an X-axis and a Y-axis perpendicular to the former.

As shown in a right side view showing a duct mounting state in FIG. 22B, the cross sectional plane of the duct 9 is parallel to a Z-axis indicated by one-dot chain line in a Y-Z plane (vertical plane) defined by the Y-axis and the Z-axis extending vertically.

The electromagnetic coil 14b' is inclined at an appropriate angle α (X-Y) plane and/or an appropriate angle β (Y-Z plane) in the X-Y plane and/or Y-Z plane from a mounting state of the conventional coil 14b, which is parallel to the cross sectional plane indicated by a one-dot chain line in FIGS. 3A and 3B into a mounting state indicated by a solid line in FIGS. 3A and 3B.

The angles α and β are optimumly determined in advance so that a depositing position on the substrate 6 is located at a central part on the surface of the substrate 6, by a charged-particle analysis simulation and a test vapor deposition process.

In the instant embodiments an angle at which the electromagnetic coil 14' is mounted on the duct 9 was manually adjusted. In the adjustment, the electromagnetic coil 14b' was inclined at the angle α and/or β with respect to the cross section of the duct 9.

A magnetic filter 18b of the deflection magnetic field 17b in FIG. 20, which is formed by appropriately correcting deflection magnetic field 17a, is formed by a magnetic field generated by the electromagnetic coil 14b'.

The drift influence by the curving of the duct 9 and the like, which is contained in the electrons and ions of the plasma stream 20b, which is generated by the magnetic filter 18b, is cancelled by the magnet generated by the electromagnetic coil 14'.

As the result of the correction as shown in FIGS. 23A and 23B as a plan view and a right side view showing electron paths, the electron paths of electrons which pass through the duct 9 and reach the surface of the substrate 6 are centered on the surface of the substrate 6. The ion deposition position lies at the canter of the surface of the substrate 6. As a result, the film forming characteristic is improved.

In FIGS. 4A and 4B only the two #2 and #4 electromagnetic coils 14b' and 14d, viz., every other coil of those electromagnetic coils, are fed with current.

To secure a further accurate drift correction, other electromagnetic coils 14a and 14c are also inclined with respect to the cross sectional plane of the duct 9, if necessary.

Of those electromagnetic coils, one or more electromagnetic coils are inclined in the X-Y plane, and the remaining ones are inclined in the X-Z plane, whereby the drift is corrected.

Another embodiment of the invention will be described with reference to FIGS. 24 through 27. In a plan view of FIG. 24, like reference numerals designate like or equivalent portions in FIG. 20. The vacuum arc vapor deposition apparatus of this embodiment is different from the FIG. 20 apparatus. In that the #2 specified magnet is formed with an electromagnetic coil 14b' that is inclined to the cross sectional plane of the duct 9, and the #4 terminal magnet is formed with the electromagnetic coil 14d' inclined to the plasma injection plane of the plasma injection hole 13, not the conventional coil 14d parallel to the plasma injection plane.

In the case of FIG. 24, the plasma injection plane is parallel to the X-Z plane as in the case of FIG. 20, the electromagnetic coil 14d' as well as the electromagnetic coil 14b' is inclined at proper angle in the X-Y plane and/or the X-Z plane, and in this state, it is mounted on the duct 9.

When electrons and ions, of which traveling paths are corrected through the correction of the magnetic field of the electromagnetic coil 14b', emanate from the duct 9, those charged particles are further corrected in their traveling paths through the correction of the magnetic field of the electromagnetic coil 14d'. The drive influence on those particles, which is due to the curving of the duct 9, is further suppressed.

Specifically, as shown in a plan view of FIG. 25, the electron and ion paths are corrected from the paths indicated by broken lines (a) to those indicated by solid lines (b), viz., those are corrected to the paths located closer to the center of the duct 9, by the #2 electromagnetic coil 14b'. Under control of the #4 electromagnetic coil 14b', the electrons and ions straight forwardly advance to the rear side and land at the central part of the surface of the substrate 6.

The electromagnetic coils 14b' and 14d' may be different in size from the remaining electromagnetic coils 14a and 14c. In particulars to effectively suppress the vertical diversion of the magnetic field, the electromagnetic coil 14d' is preferably larger than that of the other electromagnetic coils 14a, 14b' and 14c.

The result of analyzing the electron paths will be described.

To the analysis, 1) the #2 electromagnetic coil 14b' was, inclined in the X-Y plane (horizontal plane); 2) the #4 electromagnetic coil 14d' was inclined in the X-Y plane (horizontal plane), and 3) the #2 electromagnetic coil 14b' was inclined in the X-Y plane (horizontal plane), and the #4 electromagnetic coil 14d' was inclined in the Y-Z plane (vertical plane). The electron and ion paths traced in those cases 1) to 3) were as depicted in FIG. 7, viz., as indicated by broken lines (c), one-dot chain lines (d), and solid lines (e). When the #2 electromagnetic coil 14b' was inclined in the X-Y plane, and the #4 electromagnetic coil 14d' was inclined in the Y-Z plane, the diversion of the magnetic field is suppressed, and the particle paths are corrected to the upward, and toward the central part. Good correction is carried out. This fact was confirmed.

i) The #2 electromagnetic coil 14b' was inclined at 10° in the X-Y plane (horizontal plane). ii) the #4 electromagnetic coil 14d' was inclined ate 10° in the X-Y plane (horizontal plane). iii) The #4 electromagnetic coil 14d' was inclined at 5° in the X-Y plane (horizontal plane). iv) The #2 electromagnetic coil 14b' was inclined at 10° in the X-Y plane (horizontal plane), and the #4 electromagnetic coil 14d' was inclined at 5° in the Y-Z plane (vertical plane). Offsets of the electron and ion landing positions from the center on the surface of the substrate 6 in the X and Z axes were as shown in FIG. 27.

In FIG. 27, ■ is an offset of the particle landing position in the case i) above; ▲ is an offset in the case ii); ● is an offset of the case iii); and ♦ is a reference landing position when the electromagnetic coils 14b and 14d oriented in the cross sectional plane direction are provided.

As seen from FIG. 27, the most excellent film forming characteristic was gained in the case iv), and this fact was confirmed.

In FIG. 27, the current fed to the electromagnetic coil 14b' was 40 A, and the current to the electromagnetic coil 14d' was 30 A.

Usually, it is satisfactory that the cathode material 19 is sputtered and deposited onto the central part on the surface of the substrate 6. In some type of substrate 6, it is required to deposit the cathode material at a location apart from the central part of the substrate surface. In such a case, the angles α and/or β of the electromagnetic coil 14b' are set at values in accordance with use purposes, and a desired position on the surface of the substrate 6 may be selected for the deposition.

When the electromagnetic coils 14b' and 14d' are installed inclined, means for varying the mounting angles of the electromagnetic coils 14b' and 14d' may be provided. In this case, it includes a jig for varying the angle α by turning the electromagnetic coils 14b' and 14d' in an X—X plane. Another jig for varying the angle β by turning the electromagnetic coils 14b' and 14d' in a Z-Y plane are provided. One of the jigs or both the jigs are used for varying the mounting angle of the electromagnetic coil. The mounting angle of the electromagnetic coils 14b' and 14d' is initially set on the basis of the results of test film formation already made by using the mounting angle varying means. If required, the mounting angles of the electromagnetic coils 14b' and 14d' may be varied during an actual vapor deposition, by using the same.

In the embodiment described above, the magnets are all formed with the electromagnetic coils. Those magnets may be formed with permanent magnets.

In a case where the substrate 6 has a large area or plural kinds of cathode materials are deposited concurrently, a plurality of evaporating sources 11 may be provided in a vertical array.

It is practical, and in the light of film forming work efficiency, it is preferable to automatically set the mounting angle of the specified magnet or the specified magnet and the terminal magnet by use of automatic control means, which is formed by a sequence control, a program control or the like in the control unit 24 in FIG. 20 (FIG. 24), and automatically controls both the jigs in accordance with the result of measuring the film thickness on the surface of the substrate 6 by a thickness meter (not shown) previously or with progress of an actual film forming process, or to automatically vary the mounting angle of the electromagnetic coil during the film forming process.

In a case where the magnets are formed with electromagnetic coils 14a, 14b', 14c, and 14d', the coil current of the electromagnetic coils 14 and 21 may be controlled in accordance with the measurement result of the thickness meter by use of current feed control means of the control unit 24 during the film forming process, in connection with the control of the mounting angles of the electromagnetic coil. By so doing, more accurate film formation is secured.

If the direction of the coil current of the electromagnetic coils 14a, 14b', 14c, and 14d' may be reversed at fixed time intervals by the current feed control means of the control unit 24, the direction of the magnetic field B is inverted, while the direction of the gradient ∇B of the magnetic field B remains unchanged. As a result, a drift velocity changes which acts on the transportation of the plasma stream 23. Further, the direction of a traveling of the cathode material 19 toward the surface of the substrate 6 changes. As a result, the film distribution is further uniform, and hence the film formation characteristic is further ameliorated.

If the coil current to the electromagnetic coils 14a, 14b', 14c, and 14d' is fed from an AC power source, the direction of the coil current to the electromagnetic coils may be reversed at fixed time intervals without the aid of the current feed control means.

In the embodiment described above, the cross section of the duct 9 is rectangular, but it may be circular, elliptical or the like. In this case, the cross section of each magnet is preferably circular, elliptical or the like in conformity with the cross sectional configuration of the duct 9.

In the vacuum arc vapor deposition apparatus of the embodiment described above, the single duct 9 is connected to the vacuum vessel 2. Alternatively, a plurality of ducts is connected to the vacuum vessel 2. The terminal magnets of those ducts are inclined with respect to the plasma injection plane of the plasma injection hole.

For simplicity of explanation, one holder 5 is located within the film forming chamber 1, and a thin film is formed on one substrate 6 by vapor deposition. It is evident that the present invention may be applied to a case where the vacuum arc vapor deposition is applied to a plurality of substrates as in the arc type ion plating apparatus disclosed in the publication already referred to: a cylindrical, rotary holder is provided within the film forming chamber, and a plurality of substrates are held on the surfaces of the holder.

In some film forming conditions, for example, a distance between the plasma injection hole 13 and the substrate 6 is short, even if the terminal magnet is smaller than the remaining ones, good film forming characteristics are obtained sometimes. In such a case, the termination magnet may be selected to be smaller than the remaining ones, as a matter of course.

While the above-mentioned embodiment employs the curved duct 9, the present invention may be applied to a case where a bent duct is used instead.

As seen from the foregoing description, the present invention has the following useful effects.

In a vacuum arc vapor deposition process of the seventeenth aspects of the invention, of the magnets forming the magnetic filter 18b, at least one magnet (electromagnetic coil 14b') closer to the evaporating source 11 than the terminal magnet (electromagnetic coil 14d) closes to the plasma injection hole is actively inclined to the cross sectional plane of the duct, while surrounding the duct 9. In this case, the direction of the deflection magnetic field is different from that of a magnetic field generated by the conventional method, which is substantially parallel to the cross sectional plane of the duct. By appropriately selecting the inclination angle of the magnet, traveling directions of the electrons and ions extracted from the plasma stream are corrected, the drift caused by the magnetic field in the duct 9 is suppressed, and the landing position of the cathode material is little affected by the drift. Accordingly, a uniform thin film may be formed on the surface of the substrate 6, and the film forming characteristic is improved.

In a vacuum arc vapor deposition process of the invention, the specified magnet (electromagnetic coil 14b') is inclined to the cross sectional plane of the duct 9, and the terminal magnet (electromagnetic coil 14d') is inclined to the plasma injection plane of the plasma injection hole 13. A magnetic field generated by the terminal magnet is different from that in the conventional case where the terminal magnet is disposed parallel to the plasma injection plane of the plasma injection hole. By appropriately selecting the mounting angles of the specified magnet and the terminal magnet, the traveling direction of the electrons and ions is corrected under the magnetic fields by the specified magnet and the terminal magnet. As a result, the film forming characteristic is further improved.

In a vacuum arc vapor deposition process of the invention, the mounting angle of the specified magnet and/or the terminal magnet is variable. Accordingly, the mounting angle of the specified magnet and/or the terminal magnet may be varied before and during the film forming process. Vapor deposited films of various film forming characteristics may be formed having intended characteristics.

In a vacuum arc vapor deposition processes of the invention, the magnets are preferably electromagnetic coils 14a, 14b', 14c, 14d, 14d'. Further, it is preferable to automatically control the mounting angle of the specified magnet and/or the terminal magnet.

The magnets are formed with electromagnetic coils 14a to 14d', and coil current fed to the electromagnetic coils 14a to 14d' of the magnets are controlled in connection with the control of the mounting angle of the specified magnet and/or the terminal magnet. This technical feature is preferable in the light of film forming characteristic.

If a plurality of evaporating sources 11 is used, the film forming ability is improved, and plural kinds of cathode materials may be used for film formation.

The direction of the coil current fed to the electromagnetic coils 14a to 14d' forming each the magnet may be reversed at fixed time intervals. If so done, the electron drift direction is reversed, and the landing positions of the ions of the cathode material 19 are periodically shifted, and consequently, a film is formed uniformly over a substrate 6 of a large area.

What is claimed is:

1. A vacuum arc vapor deposition process, comprising the steps of:
    being evaporated a cathode material from an evaporating source by arc discharge, the cathode material being located at one end of a curved or bent duct;
    forming a magnetic filter by disposing a plurality of magnets at a plurality of locations along and around said duct, said plurality of magnets including a terminal magnet, said terminal magnet being located closest to a plasma injection hole, which is located at the other end of said duct wherein a mounting angle of said terminal magnet is variable;
    generating a deflection magnetic field within said duct by said magnetic filter;
    transporting a stream of plasma including ions of said cathode material from one end of said duct to said plasma injection hole while removing droplets generated by said evaporation of said cathode material;
    inclining said terminal magnet to a plasma injection plane of said plasma injection hole so that traveling directions of said ions of the stream of plasma are controlled by a magnetic field, said magnetic field being generated by said terminal magnet; and
    extracting said controlled ions of said plasma stream from said plasma injection hole into a film forming chamber so that said controlled ions of said plasma stream deposits onto a substrate in said film forming chamber.

2. The vacuum arc vapor deposition process according to claim 1, wherein said terminal magnet is different in size from said remaining magnets.

3. The vacuum arc vapor deposition process according to claim 1, wherein said each magnets is an electromagnetic coil.

4. The vacuum arc vapor deposition process according to claim 1, wherein a mounting angle of said terminal magnet is automatically controlled.

5. The vacuum arc vapor deposition process according to claim 1, further comprising the step of:
    controlling coil current fed to each said magnets in connection with a control of a mounting angle of said terminal magnet, each said magnets being an electromagnetic coil.

6. The vacuum arc vapor deposition process according to claim 1, wherein said evaporating source comprises a plurality of said evaporating sources.

7. The vacuum arc vapor deposition process according to claim 5, wherein a direction of said coil current fed to each electromagnetic coil is reversed at fixed time intervals.

8. A vacuum arc vapor deposition apparatus comprising:
    a film forming chamber in which a substrate is located;
    a curved or bent duct;

at least one of evaporating source being located at one end of said duct, said evaporating source including cathode material, which is evaporated by arc discharge in a vacuum;
a plasma injection hole being located at the other end of said duct and communicatively connected to said film forming chamber; and
a magnetic filter formed by disposing a plurality of magnets at a plurality of locations along and around said duct, said plurality of magnets including a terminal magnet located closest to said plasma injection hole wherein a mounting angle of said terminal magnet is variable, said magnetic filter generating a deflection magnetic field within said duct, said magnetic filter transporting a stream of plasma including ions of said cathode material from one end of said duct to said plasma injection hole while removing droplets generated by said evaporation of said cathode material, said ions of said plasma stream being extracted from said plasma injection hole into said film forming chamber, said ions being attractively guided onto said substrate, whereby said cathode material is vapor deposited on said substrate,
wherein, said terminal magnet located closest to said plasma injection hole is set to incline to a plasma injection plane of said plasma injection hole.

9. The vacuum arc vapor deposition apparatus according to claim 8, further comprising:
a device for varying the mounting angle of said terminal magnet along and around said duct.

10. The vacuum arc vapor deposition apparatus according to claim 8, wherein said terminal magnet is different in size from said remaining magnets.

11. The vacuum arc vapor deposition apparatus according to claim 8, wherein each said magnets is an electromagnetic coil.

12. The vacuum arc vapor deposition apparatus according to claim 8, further comprising:
a device for controlling a mounting angle of said terminal magnet.

13. The vacuum arc vapor deposition apparatus according to claim 11, further comprising:
a device for controlling coil current fed to each said electromagnetic coil in connection with the control of said mounting angle of said terminal magnet.

14. The vacuum arc vapor deposition apparatus according to claim 8, wherein said evaporating source comprises a plurality of evaporating sources.

15. The vacuum arc vapor deposition apparatus according to claim 11, further comprising:
a device for reversing a direction of said coil current fed to each electromagnetic coil at fixed time intervals.

16. A vacuum arc vapor deposition apparatus comprising;
a film forming chamber in which a substrate is located;
a curved or bent duct;
at least one of evaporating sources being located at one end of said duct, said evaporating sources including cathode material, which is evaporated by arc discharge in a vacuum;
a plasma injection hole being located at the other and of said duct and communicatively connected to said film forming chamber; and
a magnetic filter formed by disposing at least one of magnetic field generating coils at a plurality of locations along and around said duct, said magnetic filter generating a deflection magnetic field within said duct, said magnetic filter transporting a stream of plasma including ions of said cathode material from one end of said duct to said plasma injection hole while removing droplets generated by said evaporation of said cathode material, said ions of said plasma stream being extracted from said plasma injection hole into said film forming chamber, said ions being attractively guided onto said substrate, whereby said cathode material is vapor deposited on said substrate,
wherein said at least one of magnetic field generating coils is formed with a plurality of electromagnetic coils, which are inclined at different angles with respect to a cross section of said duct, while surrounding said duct, and
wherein one of said electromagnetic coils are selectively energized by current on a basis of setting and controlling of said deflection magnetic field generated by said magnetic filter,
wherein the magnetic field generating coils are inclined at a variable angle at the cross section of said duct.

17. The vacuum arc vapor deposition apparatus according to claim 16, wherein said plurality of electromagnetic coils surrounding said duct are provided while being inclined at different angles in one of two planes perpendicular to a cross section of said duct.

18. The vacuum arc vapor deposition apparatus according to claim 16, wherein said plurality of electromagnetic coils surrounding said duct are different in coil size.

19. The vacuum arc vapor deposition apparatus according to claim 16, wherein said plurality of electromagnetic coils surrounding said duct are equal or substantially equal in coil size.

20. A vacuum arc vapor deposition process, comprising the steps of:
being evaporated a cathode material from an evaporating source by arc discharge, the cathode material being located at one end of a curved or bent duct;
forming a magnetic filter by disposing a plurality of magnets at a plurality of locations along and around said duct, said plurality of magnets including a terminal magnet closest to a plasma injection hole located at the other end of said duct and at least one of specified magnets;
generating a deflection magnetic field within said duct by said magnetic filter;
transporting a stream of plasma including ions of said cathode material from one end of said duct to said plasma injection hole while removing droplets generated by said evaporation of said cathode material;
inclining said at least one of specified magnets to a plasma injection plane of said plasma injection hole at a variable angle so that traveling directions of said ions of the stream of plasma are controlled by a magnetic field, which is generated by said at least one of specified magnets; and
extracting said controlled ions of said plasma stream from said plasma injection hole into a film forming chamber so that said controlled ions of said plasma stream deposits onto a substrate in said film forming chamber,
wherein magnetic field generating coils are inclined at a cross section of said duct.

21. The vacuum arc vapor deposition process according to claim 20, wherein said terminal magnet is inclined to said plasma injection plane of said plasma injection hole, and wherein said traveling directions of ions of said cathode material are controlled by magnetic fields, which are generated by both said at least one of specified magnets and said terminal magnet.

22. The vacuum arc vapor deposition process according to claim 20, wherein a mounting angle of said at least one of specified magnets and/or said terminal magnet is variable.

23. The vacuum arc vapor deposition process according to claim 20, wherein said plurality of magnets are electromagnetic coils.

24. The vacuum arc vapor deposition process according to claim 20, wherein a mounting angle of said at least one of specified magnets and/or said terminal magnet is automatically controlled.

25. The vacuum arc vapor deposition process according to claim 20, wherein said plurality of magnets are electromagnetic coils, and wherein coil current fed to each said electromagnetic coils is controlled in connection with control of mounting angle of said at least one of specified magnets and/or said terminal magnet.

26. The vacuum arc vapor deposition process according to claim 20, wherein said at least one of evaporating sources comprises said evaporating sources.

27. The vacuum arc vapor deposition process according to claim 23, wherein direction of coil current fed to each said electromagnetic coils is reversed at fixed time intervals.

28. A vacuum arc vapor deposition apparatus comprising:
a film forming chamber in which a substrate is located;
a curved or bent duct;
at least one of evaporating source being located at one end of said duct, said evaporating source including cathode material, which is evaporated by arc discharge in a vacuum;
a plasma injection hole being located at the other end of said duct and communicatively connected to said film forming chamber; and
a magnetic filter formed by disposing a plurality of magnets at a plurality of locations along and around said duct, said magnetic filter generating a deflection magnetic field within said duct, said magnetic filter transporting a stream of plasma including ions of said cathode material from one end of said duct to said plasma injection hole while removing droplets generated by said evaporation of said cathode material, said ions of said plasma stream being extracted from said plasma injection hole into said film forming chamber, said ions being attractively guided onto said substrate, whereby said cathode material is vapor deposited on said substrate,
wherein said plurality of magnets includes a terminal magnet closest to a plasma injection hole located at the other end of said duct and at least one of specified magnets,
and wherein at least one of specified magnets is inclined to a plasma injection plane of said plasma injection hole at a variable angle,
wherein magnetic field generating coils are inclined at a cross section of said duct.

29. The vacuum arc vapor deposition apparatus according to claim 28, wherein said terminal magnet is inclined to said plasma injection plane of said plasma injection hole.

30. The vacuum arc vapor deposition apparatus according to claim 28, further comprising:
a device for varying a mounting angle of said at least one of specified magnets and/or said terminal magnet.

31. The vacuum arc vapor deposition apparatus according to claim 28, wherein said magnets are electromagnetic coils.

32. The vacuum arc vapor deposition apparatus according to claim 28, further comprising:
a device for automatically controlling a mounting angle of said at least one of specified magnets.

33. The vacuum arc vapor deposition apparatus according to claim 31, further comprising:
a device for controlling coil current fed to each said electromagnetic coils of in connection with a control of mounting angle of said at least one of specified magnets and/or said terminal magnet.

34. The vacuum arc vapor deposition apparatus according to claim 28, wherein a plurality of said evaporating sources are provided.

35. The vacuum arc vapor deposition apparatus according to claim 28, further comprising:
a device for reversing a direction of coil current fed to each said electromagnetic coils at fixed time intervals.

* * * * *

UNITED STATES PATENT AND TRADEMARK OFFICE
CERTIFICATE OF CORRECTION

PATENT NO. : 7,033,462 B2  Page 1 of 1
APPLICATION NO. : 10/305008
DATED : April 25, 2006
INVENTOR(S) : Yasuo Murakami et al.

It is certified that error appears in the above-identified patent and that said Letters Patent is hereby corrected as shown below:

Title page, item (57), line 8, "lease " should read --least--.

Claim 16, col. 25, line 53, "comprising," should read --comprising:--.

Claim 16, col. 25, line 60, "other and" should read --other end--.

Claim 16, col. 26, line 14, "are" should read --is--.

Signed and Sealed this

Thirteenth Day of February, 2007

JON W. DUDAS
*Director of the United States Patent and Trademark Office*